(12) United States Patent
Sankaragomathi et al.

(10) Patent No.: US 11,171,625 B1
(45) Date of Patent: Nov. 9, 2021

(54) INCREASING YIELD AND OPERATING TEMPERATURE RANGE OF TRANSMITTERS

(71) Applicant: Verily Life Sciences LLC, South San Francisco, CA (US)

(72) Inventors: Kannan Sankaragomathi, San Mateo, CA (US); Justin Schauer, San Francisco, CA (US); Robert Wiser, San Francisco, CA (US); Daniel Yeager, San Francisco, CA (US)

(73) Assignee: VERILY LIFE SCIENCES LLC, South San Francisco, CA (US)

( * ) Notice: Subject to any disclaimer, the term of this patent is extended or adjusted under 35 U.S.C. 154(b) by 475 days.

(21) Appl. No.: 16/033,671

(22) Filed: Jul. 12, 2018

Related U.S. Application Data

(60) Provisional application No. 62/532,439, filed on Jul. 14, 2017.

(51) Int. Cl.
| | |
|---|---|
| *H03H 9/02* | (2006.01) |
| *H03L 7/099* | (2006.01) |
| *H03L 7/197* | (2006.01) |
| *H03B 5/04* | (2006.01) |
| *H03B 5/32* | (2006.01) |
| *H04L 27/12* | (2006.01) |

(52) U.S. Cl.
CPC ........... *H03H 9/02102* (2013.01); *H03B 5/04* (2013.01); *H03B 5/326* (2013.01); *H03L 7/099* (2013.01); *H03L 7/1976* (2013.01); *H04L 27/125* (2013.01); *H03H 2009/02196* (2013.01)

(58) Field of Classification Search
CPC ...... H03H 9/02102; H03H 2009/02196; H03L 7/099; H03L 7/1976; H03B 5/326; H03B 5/04; H04B 1/02; H04B 10/556; H04L 27/125
USPC ..... 331/176, 158, 16, 34, 36 C, 154, 116 M; 375/295, 303; 332/138; 455/255, 262
See application file for complete search history.

(56) References Cited

U.S. PATENT DOCUMENTS

| | | | |
|---|---|---|---|
| 7,371,005 B1 * | 5/2008 | Ahuja | G04F 5/06 331/176 |
| 8,873,682 B2 * | 10/2014 | Mehio | H03J 7/045 375/344 |
| 2004/0092234 A1 | 5/2004 | Pohjonen | |

(Continued)

OTHER PUBLICATIONS

U.S. Appl. No. 15/237,623, filed Aug. 15, 2016.
(Continued)

*Primary Examiner* — Arnold M Kinkead
(74) *Attorney, Agent, or Firm* — Kilpatrick Townsend & Stockton LLP

(57) ABSTRACT

Examples of increasing yield and operating temperature range of transmitters are disclosed. In one example, a transmitter has an a thin-film bulk acoustic (FBAR) resonator. The transmitter may be a Bluetooth Low Energy (BLE) transmitter. In this example, the FBAR-based BLE transmitter does not require or have a phase locked loop, and does not require or have a crystal reference. The FBAR-based BLE transmitter may have an oscillator with a split capacitor array. The oscillator may be a Pierce oscillator with a split capacitor array. The FBAR-based transmitter and calibration methods described herein provide a greater yield and wider operating range than prior transmitters.

35 Claims, 12 Drawing Sheets

(56) References Cited

U.S. PATENT DOCUMENTS

| | | |
|---|---|---|
| 2005/0099236 A1 | 5/2005 | Kawakubo et al. |
| 2005/0110598 A1 | 5/2005 | Larson |
| 2006/0001329 A1 | 1/2006 | Rao et al. |
| 2009/0134947 A1* | 5/2009 | Tarng .................. H03B 5/1228 331/116 FE |

OTHER PUBLICATIONS

Hu et al., "A 1.56 GHz wide-tuning all digital FBAR-based PLL in 0.13 μm CMOS", Custom Integrated Circuits Conference (CICC), 2010 IEEE. IEEE, 2010.

Paidimarri et al., "A 2.4 GHz multi-channel FBAR-based transmitter with an integrated pulse-shaping power amplifier", IEEE Journal of Solid-State Circuits 48.4 (2013): 1042-1054.

Sridaran et al., "Low Jitter FBAR based chip scale precision oscillator", Ultrasonics Symposium (IUS), 2014 IEEE International. IEEE, 2014.

Tallur et al., "Extremely Wide Tuning Range of Mechanical Oscillation of a Silicon Waveguide Driven by Optical Gradient Force", Solid-State Sensors, Actuators and Microsystems Workshop, 2016.

* cited by examiner

|  |  | $i = 0$ | $i = 1$ | $i = 2$ |
|---|---|---|---|---|
|  | Coarse Cap Array Code $CC_p = CC\_MIN + p$ | Temperature = $T_0$ | Temperature = $T_1$ | Temperature = $T_2$ |
| $p = 0$ | $CC_0 = CC\_MIN$ | $FC_{0,0}, f_{slope0,0}$ | $FC_{1,0}, f_{slope1,0}$ | $FC_{2,0}, f_{slope2,0}$ |
| $p = 1$ | $CC_1 = CC\_MIN+1$ | $FC_{0,1}, f_{slope0,1}$ | $FC_{1,1}, f_{slope1,1}$ | $FC_{2,1}, f_{slope2,1}$ |
| $p = 2$ | $CC_2 = CC\_MIN+2$ | $FC_{0,2}, f_{slope0,2}$ | $FC_{1,2}, f_{slope1,2}$ | $FC_{2,2}, f_{slope2,2}$ |
| $p = 3$ | $CC_3 = CC\_MIN+3$ | $FC_{0,3}, f_{slope0,3}$ | $FC_{1,3}, f_{slope1,3}$ | $FC_{2,3}, f_{slope2,3}$ |
| $p = 4$ | $CC_4 = CC\_MIN+4$ | $FC_{0,4}, f_{slope0,4}$ | $FC_{1,4}, f_{slope1,4}$ | $FC_{2,4}, f_{slope2,4}$ |
| $p = 5$ | $CC_5 = CC\_MIN+5$ | $FC_{0,5}, f_{slope0,5}$ | $FC_{1,5}, f_{slope1,5}$ | $FC_{2,5}, f_{slope2,5}$ |
| $p = 6$ | $CC_6 = CC\_MIN+6$ | $FC_{0,6}, f_{slope0,6}$ | $FC_{1,6}, f_{slope1,6}$ | $FC_{2,6}, f_{slope2,6}$ |
| $p = 7$ | $CC_7 = CC\_MIN+7$ | $FC_{0,7}, f_{slope0,7}$ | $FC_{1,7}, f_{slope1,7}$ | $FC_{2,7}, f_{slope2,7}$ |
| $p = 8$ | $CC_8 = CC\_MIN+8$ | $FC_{0,8}, f_{slope0,8}$ | $FC_{1,8}, f_{slope1,8}$ | $FC_{2,8}, f_{slope2,8}$ |
| $p = 9$ | $CC_9 = CC\_MIN+9$ | $FC_{0,9}, f_{slope0,9}$ | $FC_{1,9}, f_{slope1,9}$ | $FC_{2,9}, f_{slope2,9}$ |

| | $i = 0$ | $i = 1$ | $i = 2$ |
|---|---|---|---|
| | Temperature $T_0$ | Temperature $T_1$ | Temperature $T_2$ |
| Temperature Sensor Measurement | $D_{TEMP,0}$ | $D_{TEMP,1}$ | $D_{TEMP,2}$ |

900

| Variable | Set Value To |
|---|---|
| Trim Coefficient A | $COEFF\_A_p$ |
| Trim Coefficient B | $COEFF\_B_p$ |
| Coarse Oscillator Offset | $CC_p$ |
| Fine Oscillator Offset | $OFFSET_p$ |
| Oscillator Frequency Delta | $\text{round}(-200 / f_{\text{slope mean},p})$ |

Figure 9

INCREASING YIELD AND OPERATING TEMPERATURE RANGE OF TRANSMITTERS

CROSS-REFERENCE TO RELATED APPLICATION

This application claims the benefit of U.S. Application No. 62/532,439, filed Jul. 14, 2017, titled "Increasing Yield and Operating Temperature Range of Transmitters," which is incorporated herein by reference in its entirety.

FIELD

The present application generally relates to transmitters and more generally relates to radio frequency transmitters.

BACKGROUND

Portable computing devices, such as laptop computers, tablets, cell phones, smartphones, wearable devices, and other Internet-capable devices are prevalent in numerous aspects of modern life. Such devices often have a transmitter to wirelessly connect to another device. For example, Bluetooth may be used to connect a cell phone to a wireless headset, possibly allowing for hands-free use of the phone. The yield and operating temperature range of traditional transmitters are limited because of non-idealities. Accordingly, transmitters and calibration methods that support a wider range of non-idealities to increase the yield and the operating temperature range of the transmitters are needed

SUMMARY

Various examples are described for increasing the yield and/or operating temperature range of transmitters.

One example method includes for each temperature of a plurality of temperatures: iteratively configuring a coarse capacitor array in the transmitter by iteratively setting a coarse capacitor array code for the coarse capacitor array at that temperature, the coarse capacitor array corresponding to an oscillator in the transmitter, the oscillator corresponding to a resonator in the transmitter; iteratively configuring a fine capacitor array in the transmitter for each of the iteratively set coarse capacitor array codes at that temperature by sweeping through fine capacitor array codes for the fine capacitor array to identify a fine capacitor array code that reduces frequency offset at that coarse capacitor array code at that temperature, the fine capacitor array corresponding to the oscillator; determining a slope of frequency corresponding to the resonator for each of the iteratively set coarse capacitor array codes at that temperature; and measuring a temperature sensor output corresponding the transmitter at that temperature; and using at least the identified fine capacitor array codes, the determined slopes of frequency corresponding to the resonator, and the measured temperature sensor outputs to calibrate the transmitter.

Another example method includes obtaining a temperature of an oscillator in a transmitter, the oscillator corresponding to a resonator in the transmitter; determining a frequency drift corresponding to the oscillator at the temperature based at least in part on a linear term corresponding to the temperature and a temperature shift; generating a temperature compensation signal based at least in part on the frequency drift; generating a data modulation signal based at least in part on a modulation scheme; tuning a capacitor array corresponding to the oscillator based at least in part on the temperature compensation signal and the data modulation signal; and after tuning the capacitor array corresponding to the oscillator, generating, by the oscillator, a modulated RF signal within a threshold frequency drift.

One example system includes a resonator; a Pierce oscillator corresponding to the resonator; a split capacitor array corresponding to the Pierce oscillator; a temperature sensor; a memory; and a processor communicatively coupled to the Pierce oscillator, the split capacitor array, the temperature sensor, and the memory. In examples, the split capacitor array comprises: a first capacitor array coupled to a first side of the Pierce oscillator, the first capacitor array comprising a first fine capacitor array; and a second capacitor array coupled to a second side of the Pierce oscillator opposite the first side, the second capacitor array comprising a second fine capacitor array. In examples, the processor is configured to receive executable instructions from the memory which, when executed by the processor, cause the processor to: obtain a temperature from the temperature sensor; determine a frequency drift corresponding to the Pierce oscillator at the temperature based at least in part on a linear term corresponding to the temperature and a temperature shift; generate a temperature compensation signal based at least in part on the frequency drift; generate a data modulation signal based at least in part on a modulation scheme; generate a tuning signal based at least in part on the temperature compensation signal and the data modulation signal; and output the tuning signal to at least one of the first fine capacitor array or the second fine capacitor array.

One example non-transitory computer-readable medium includes processor-executable instructions configured to cause a processor to obtain a temperature of an oscillator in a transmitter, the oscillator corresponding to a resonator in the transmitter; determine a frequency drift corresponding to the oscillator at the temperature based at least in part on a linear term corresponding to the temperature and a temperature shift; generate a temperature compensation signal based at least in part on the frequency drift; generate a data modulation signal based at least in part on a modulation scheme; tune a capacitor array corresponding to the oscillator based at least in part on the temperature compensation signal and the data modulation signal; and after tuning the capacitor array corresponding to the oscillator, cause the oscillator to generate a modulated RF signal within a threshold frequency drift.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples.

FIG. 7 shows an example measurement table for the example method shown in FIG. 6 according to an example.

FIG. 9 shows an example table of variables and values for registers corresponding to the example method shown in FIG. 6 according to an example.

DETAILED DESCRIPTION

Examples are described herein in the context of devices, systems, and methods for increasing the yield and/or operating temperature range of transmitters, such as BLE transmitters. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Bluetooth continues to grow as the standard wire-replacement protocol, and remains particularly attractive due to its protocols designed for low power consumption. Specifically, Bluetooth Low Energy (BLE), an extension of Bluetooth technology, may be attractive in applications where low power consumption may be advantageous.

In particular, BLE provides protocols for low power devices to communicate with multiple other devices. For example, consider a device that can be powered by one or more batteries. Further, consider that the device may be used in an application where replacing or recharging the one or more batteries may not be easily achievable. Accordingly, the device may be a low power device to preserve the charge of its power source. As such, the device may utilize BLE's protocols for communicating with other devices, such as computing devices (e.g., phones, laptops, and wearable computing devices). In an example, the low power device, e.g., a sensor, may utilize BLE protocols to transmit data (e.g., sensor data) to a computing device.

Figure 1:
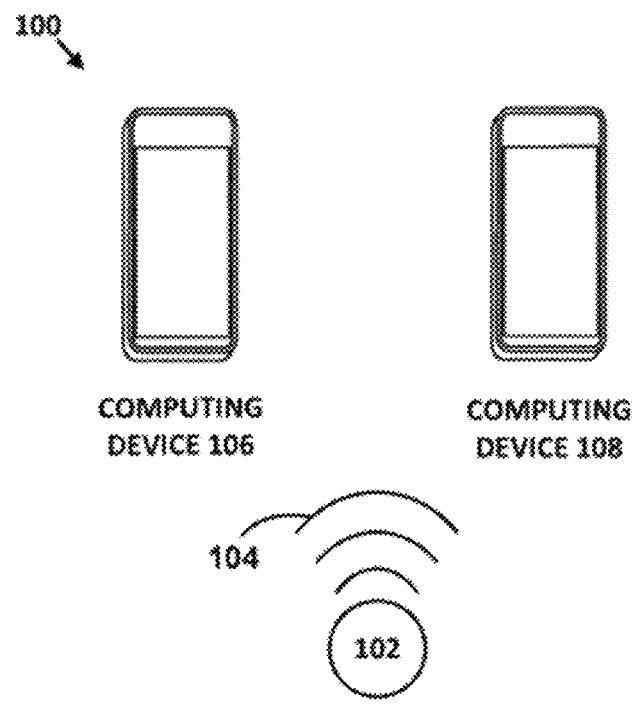
FIG. 1 shows computing devices located in proximity to a beacon according to an example.

FIG. 1 illustrates an example scenario 100 of a device utilizing BLE protocols. The BLE protocols may be carried out by a low power device 102 (also referred to herein as a "beacon"), which may include a sensor. More specifically, the beacon 102 may include a BLE device or module, which may transmit and/or receive a signal 104 according to BLE protocols. The power source of a BLE device may be one or more batteries. In some examples, the one or more batteries may be the one or more batteries of the beacon 102 in which the BLE device is incorporated. The power source of a BLE device can be a wired power source. Further, the beacon 102 may transmit, according to BLE protocols, the signal 104 to the computing devices 106 and/or 108.

However, it should be understood that the arrangement for the beacon 102 provided in FIG. 1 is for purposes of illustration only. For example, the beacon 102 may be included in any device, such as a phone (i.e., computing device), a digital television, a monitor, a tablet computer, wearable computing devices, and/or a human-interface device, among other possibilities. Further, in some examples, the beacon 102 may transmit a signal 104 to more than or fewer than two computing devices.

In scenario 100, each of the computing devices 106 and 108 may include a Bluetooth module, which may perform a Bluetooth scan to search for other Bluetooth devices and/or for signals from Bluetooth devices. In some examples, the computing devices 106 and 108 may scan for Bluetooth devices in order to pair with a Bluetooth device that is within a range of the Bluetooth scan of the computing devices. In other examples, at least one of the computing devices 106 and 108 may receive a signal from a Bluetooth device without pairing with the Bluetooth device. For example, at least one of the computing devices may receive a Bluetooth signal, e.g., signal 104, from the beacon 102 without pairing with the beacon 102.

Furthermore, scenario 100 may be a scenario where low power consumption by the beacon 102 is desirable. For example, the power source of the beacon 102 may have limited charge. In such a scenario, low power consumption by the beacon 102 may be desirable to extend the life of the power source. Generally, the power consumption of a BLE device may be governed by the configuration of the BLE device and/or the hardware of the BLE device. Accordingly, the BLE devices disclosed herein may be described in relation to at least decreasing power consumption.

The performance of the beacon 102 may be affected by external factors, such as environmental factors. For example, the performance of the beacon 102's components may vary with temperature. A change in the temperature of the beacon 102 (e.g., due to environmental factors) may affect the frequency of the signal 104. More specifically, the frequency of the signal 104 may drift from the frequency of the channel on which the beacon 102 may be operable to transmit the signal 104. The frequency of the channel on which the beacon 102 may be operable to transmit the signal 104 may also be referred to herein as a "target frequency." Similarly, the channel on which the beacon 102 may be operable to transmit the signal 104 may be referred to herein as a "target channel."

The frequency drift may cause interference issues as the frequency of the signal 104 drifts into the frequency range of other channels. Further, the computing devices 106 and 108 may be scanning the channel on which the beacon 102 may be operable to transmit the signal 104 in order to receive the signal 104. The computing device 106 and 108 may not receive the signal 104 if the frequency of the signal 104 drifts from the frequency of the channels that the computing devices 106 and 108 may be scanning.

Disclosed herein is a method of using open-loop temperature compensation to mitigate the effects that temperature may have on the performance of the beacon 102. Temperature compensation may include calculating a compensation signal that may be applied to the components of the beacon 102 such that the beacon 102 transmits the signal 104 at or within a threshold of a target frequency.

Example Systems and Methods

Figure 2:
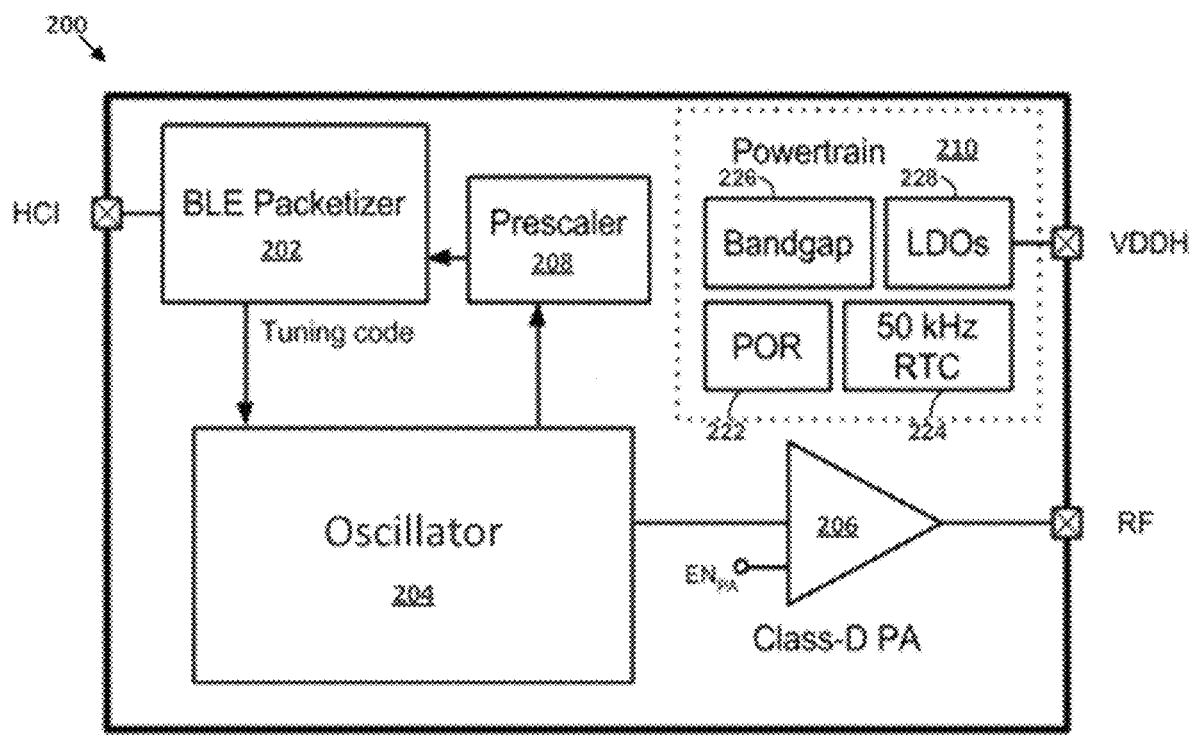
FIG. 2 shows a schematic diagram of a transmitter according to an example.

FIG. 2 schematically illustrates a BLE transmitter 200 according to an example. In some examples, the BLE transmitter 200 may be included in other devices as a Bluetooth module. For instance, a BLE module may be included in or coupled with the beacon 102 in scenario 100. A device, such as beacon 102, that includes a BLE module may be referred to as a "host device." Accordingly, a BLE module may receive instructions from a processor and/or a memory of a host device. A controller of a BLE module may interface with the host stack of its host device via a Host Controller Interface (HCI). For example, the BLE transmitter 200 may receive a signal via the HCI, which may include data that may be transmitted by the BLE transmitter 200. In some examples, the host stack and the controller of a BLE module may be implemented on different processors. In other examples, the host stack and the controller of a BLE module may be implemented on the same processor.

As illustrated in FIG. 2, the BLE transmitter 200 may include a BLE packetizer 202, an oscillator 204, a powertrain 210, and an amplifier 206. The BLE transmitter 200 may also include an antenna (not illustrated in FIG. 2). Additionally and/or alternatively, the antenna may be part of the host device. These components, as described herein, may be used to transmit a signal 104 from the BLE transmitter 200. Accordingly, in some examples, a BLE module includes only BLE transmitter 200 as a communication interface. Such a BLE module may operate solely as a transmitter (also referred to herein as a "broadcaster"). For instance, in scenario 100, the beacon 102, using the BLE transmitter 200, may transmit a signal, which may be received by the computing devices 106 and 108, without pairing with or receiving a signal from the computing devices.

In other examples, the BLE transmitter 200 may operate as a transmitter of a transceiver BLE device. A transceiver BLE device may include components that may be used to transmit and receive a signal. For instance, the transceiver may include, along with the transmitter 200's components illustrated in FIG. 2, a low-noise amplifier (LNA), a mixer (e.g., I/Q mixer), a local oscillator (LO), a variable gain amplifier, filters (e.g., baseband filter), and an analog-digital-converter (ADC). The transceiver may also include an antenna that may be used to transmit and receive signals. For instance, in scenario 100, the beacon 102, using a BLE transceiver, may transmit a signal, which may be received by the computing devices 106 and 108. The beacon 102 may also receive a signal from the computing devices 106 and 108.

Returning to FIG. 2, the BLE packetizer 202 may receive a signal via the HCI. As explained elsewhere herein, the signal may originate from a processor of a host device. Further, the received signal may include packet data that may be included in the signal transmitted by the BLE transmitter 200. The received signal may also include data indicative of a configuration of the BLE module. For example, the received signal may include parameters, such as encryption parameters, modulation parameters, a mode of operation of the BLE module, packet type, etc. The received parameters may be used to configure the BLE module to generate a signal, which may be transmitted by the antenna.

For instance, the signal received via the HCI may be indicative of a mode of operation of the BLE module. Within examples, the mode of operation may depend on the functionality of the BLE module. In some examples, the functionality of a BLE module may be predetermined and fixed, as the BLE module may be used in a single application. In other instances, a user may provide an input indicative of the mode of operation to the host computing device. In particular, the user may provide an input to an input/output function of the computing device, possibly a graphical user-interface (GUI), to specify the mode of operation.

In some examples, the modes of operation of the BLE device 200 may include an advertising mode in which a BLE advertising protocol is used to periodically transmit data packets referred to as advertising packets (also referred to herein as "advertisement packets"). Despite their name, these data packets typically have no relation to "advertisements" in the marketing sense of the word. Rather, such data packets are referred to as advertising packets because they may be used to announce various data to one or more other devices capable of receiving the announcement. The advertising packets may carry data indicative of the BLE device 200 (e.g., a unique identification number (UID)). Alternatively or additionally, advertising packets may carry data indicative of or information from a device that may include the BLE device 200 as a Bluetooth module. For example, the host device may use advertising packets to possibly "pair" or connect with another device.

In another example, a BLE module may use advertising packets to advertise data, such as geographical data, which may have been stored in a memory of its host device. In an example, the beacon 102 may be used in scenario 100 as a location beacon. Thus, the beacon 102 may use a BLE module to broadcast a signal that may provide one of the computing devices with precise geographical information. In yet other examples, a BLE module may be used to transmit advertising packets, which may include data that may have been collected by the host device. For example, the advertising packets may include meteorological data gathered by a sensor of the host device.

Furthermore, in some instances, the mode of operation of a BLE module may affect its power consumption. For example, a BLE module may decrease its power consumption by using advertising protocols. Advertising protocols may maintain the low power consumption of a BLE module by periodically broadcasting a signal during certain time intervals. During time intervals when a BLE module is not broadcasting a signal, the BLE module may idle in a standby mode. Alternatively, the BLE module may turn off Accordingly, by turning on only when transmitting a signal in an active transmit mode, a BLE module may decrease its power consumption, which may be advantageous for devices with a finite power source. As such, advertising protocols are designed to allow a BLE module to advertise data to one or more computing devices while maintaining the low power consumption.

Furthermore, BLE protocols include different types of advertising packets. The advertising packet type may at least specify a configuration of a BLE module. For instance, the advertising packet type may specify whether the BLE module is connectable and/or scannable. A connectable BLE module may pair with another Bluetooth device, and a scannable BLE module may transmit a data packet in response to receiving a scan request from another Bluetooth device. Furthermore, an advertising packet may be a directed packet. A directed packet may include a BLE module's address and the receiver device's address, whereas an undirected packet may not be directed toward a particular receiver.

In some examples, a BLE module may include only the BLE transmitter 200 and, therefore, may not be able to operate in a connectable configuration. Furthermore, the transmitter 200 may not be able to receive scan requests from other Bluetooth devices. Accordingly, in some examples, a BLE module may operate in a non-connectable and non-scannable configuration in order to decrease power consumption. However, in other examples, a BLE module may include a transceiver. In such examples, the BLE module may operate in a connectable and/or a scannable configuration.

There can be other advantages to the BLE advertising protocols in addition to low power consumption of a BLE module operating in accordance with advertising protocols. For example, in scenario 100, the computing devices 106 and 108 may discover Bluetooth devices located near the computing device faster (and consuming less energy) using advertising protocols than by using other protocols. As described elsewhere herein, advertising protocols may use three fixed channels of a wireless spectrum, e.g., the 2.4 GHz wireless spectrum. Thus, the computing devices 106 and 108 may detect other Bluetooth devices by only scanning the three fixed channels, rather than scanning a broad wireless spectrum, which may allow for receiving and sending BLE advertisement packets faster than other protocols.

Returning to FIG. 2, the BLE packetizer 202 may use the data included in the signal received via the HCI to generate a data signal, which may include one or more data packets. Accordingly, the BLE packetizer 202 may receive instructions to generate a data signal including one or more data packets according to the advertising protocol. Further, the instructions may detail the type of advertising packet to broadcast. For instance, as explained above, the type of advertising packet may determine whether a BLE module is connectable and/or scannable, and/or whether the packet is directed. In an example, the BLE packetizer 202 may receive data indicative of instructions to generate a data signal that includes a non-connectable, non-scannable, and undirected advertising packet. In another example, the BLE packetizer 202 may receive data indicative of instructions to generate a data signal that includes a scannable and undirected advertising packet.

Figure 3:
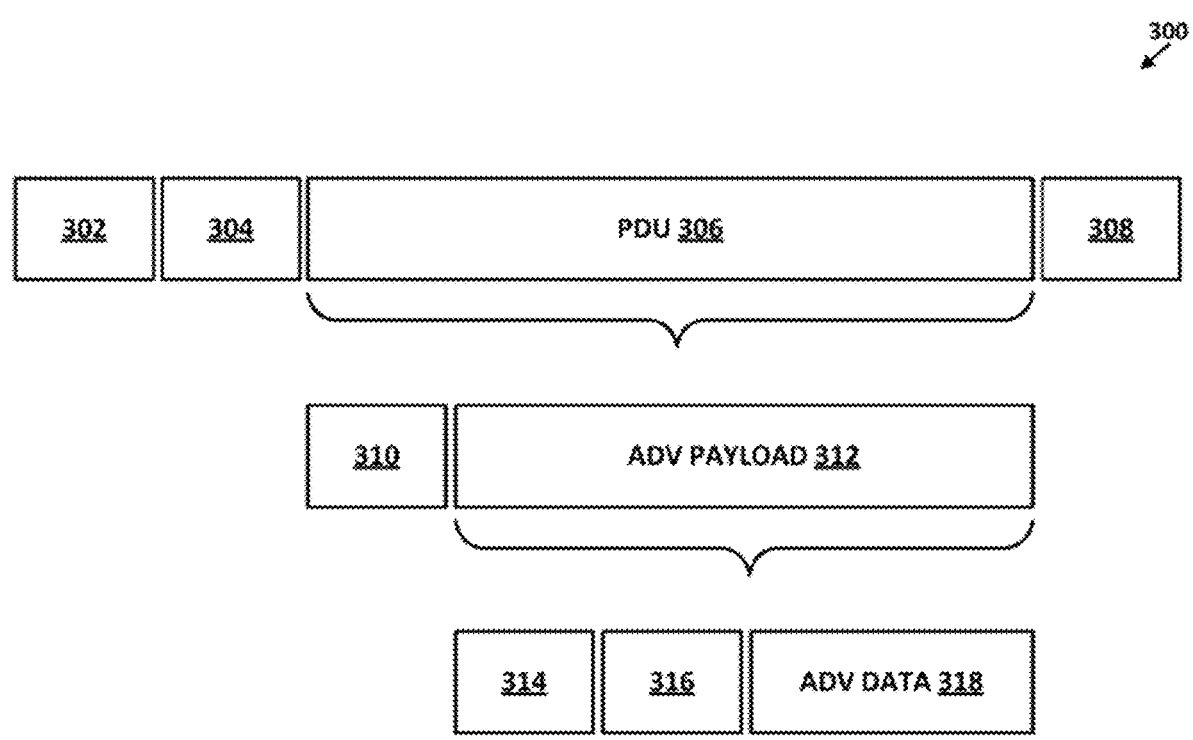
FIG. 3 illustrates an advertisement packet according to an example.

FIG. 3 illustrates an example advertising packet. In particular, an advertising packet 300 may, for example, take the form of any advertising packets described above in relation to the FIG. 1. In some additional embodiments, a Bluetooth tag or a BLE module may communicate the advertisement packet 300. As shown in FIG. 3, advertising packet 300 may include preamble 302, access address 304, payload data unit (PDU) 306 with 2 to 39 bytes, and cyclic redundancy check (CRC) 308.

In addition, PDU 306 may include header 310 and advertisement payload 312 with 6 to 37 bytes. Further, advertisement payload 312 may include header 314, MAC address 316, and advertisement data 318 with up to 31 bytes. In an example, the 31-byte space may contain sensor data that may be communicated via the advertisement packet. Other sizes of the PDU 306 may be possible. For example, the PDU 306 may include data greater than 39 bytes. Similarly, any of the components of the PDU 306 may include data greater or less than the sizes described above. Further, the CRC may include data codes which may detect any errors that may occur in the PDU 306 during transmission. Further, the header 314 may include a type of the PDU 306. The type of PDU 306 may specify the type of the advertisement packet. As explained above, the advertisement packet type may be a non-connectable, scannable, and undirected packet type. In various examples, other advertising packets and/or additional advertising packets having a different format than discussed above with respect to FIG. 3 may be used. For example, an advertising packet may be different in a future BLE specification.

Returning to FIG. 2, the oscillator 204 may generate an RF carrier signal that may carry the data signal generated by the BLE packetizer 202. The RF signal carrying the data may then be broadcast by an antenna. As illustrated in FIG. 2, the oscillator 204 may be a free-running oscillator, which may be used to directly generate an RF carrier signal. Thus, a free-running oscillator may replace a frequency synthesizer (e.g., Phase Locked Loop (PLL) synthesizer) to generate an RF carrier signal. Using a free-running oscillator may result in considerable power savings as compared to using a frequency synthesizer, which may be advantageous for low power devices.

Further, both the turn-on time for the frequency synthesizer to lock to its frequency reference and the turn-on time of its frequency reference circuit may be significant compared to the packet duration. Therefore, the turn-on time (i.e., the time to go from sleep mode to active transmit mode) for a transmitter using a frequency synthesizer may be greater than a transmitter using a free-running oscillator. A longer turn-on time may result in greater power dissipation. Accordingly, using the free-running oscillator, which may have a reduced turn-on time compared to a frequency synthesizer, may result in further power savings.

The free-running oscillator may directly generate the RF carrier signal, which may have a frequency within a wireless spectrum, e.g., the 2.4 GHz wireless spectrum. Within examples, the free-running oscillator may directly generate an RF carrier signal that has a frequency of one of the three channels in the 2.4 GHz band that are allocated to BLE advertising protocols according to Bluetooth specifications. The three "advertisement channels" are specified as 1 MHz wide channels with frequencies of 2.402 GHz, 2.480 GHz, and 2.426 GHz.

Note that the example oscillator provided in FIG. 2 and the accompanying description herein is for illustrative purposes only and should not be considered limiting. For instance, the transmitter 200 may include more than one free-running oscillator. In an example, the BLE transmitter 200 may include three free-running oscillators, each of which may be used to generate a carrier signal at a frequency of the three BLE channels. In such examples, the BLE transmitter 200 may utilize methods such as multichannel transmission and frequency hopping.

Within examples, the free-running oscillator 204 may include a Pierce oscillator circuit or a Colpitts oscillator circuit. The oscillator 204 may include a transistor, a biasing resistor, capacitors, and a resonator. The resonator, which may be located off of the IC of the BLE transmitter 200, may be used as a filter to filter the oscillation frequency. Further, the total capacitance of the capacitors in the oscillator 204, as seen by the resonator, may be referred to as the "load capacitance." The load capacitance may affect how far the oscillator loop is resonating, relative to the desired resonant frequency. Accordingly, selectively choosing the resonator, which may have a specific load capacitance requirement, may determine the oscillation frequency.

Within examples, the resonator in the oscillator 204 may be a thin-film bulk acoustic resonator (FBAR). In other examples, the resonator (such as an FBAR resonator) may be a separate component from oscillator 204. In these examples, the resonator can be coupled to oscillator 204. An FBAR resonator may include a piezoelectric thin film between two metal layers. FBAR resonators are high-Q resonators that may have a stable and a low phase-noise center frequency, which may be the oscillation frequency. Within examples, FBAR resonators may have a Q of several hundred. In other examples, FBAR resonators may have an (unloaded) Q of over two thousand. Further, temperature compensation may be used to maintain the center frequency of the FBAR resonator at the frequency of the wireless channel.

Note that the example resonator discussed above is for illustrative purposes only and should not be considered limiting. For instance, the resonator may be any resonator that may be a high frequency resonator, which may provide an oscillation frequency with a stability and an accuracy that may meet Bluetooth standards. In other examples, the resonator may be a crystal resonator. In yet another example, the resonator may be a quartz resonator.

As noted above, the RF carrier signal generated by the oscillator 204 may be used to carry the data signal generated by the BLE packetizer 202. More specifically, the data signal generated by the BLE packetizer 202 may act as a tuning code, which may have a specific symbol rate. Further, the tuning code may be used to directly modulate the RF carrier signal. Accordingly, the modulated RF carrier signal may carry the data signal generated by the BLE packetizer 202. Within examples, the tuning code may modulate the RF carrier signal according to at least BLE protocols.

For instance, BLE protocols specify using Gaussian Frequency Shift Keying (GFSK) as the modulation scheme to modulate the RF carrier signal. Accordingly, the tuning code may be used to modulate the RF carrier signal to two different frequencies of the same advertising channel according to GFSK. Additionally and/or alternatively, the tuning code may be used to modulate the RF carrier signal to two different frequencies of the same advertising channel according to Binary Frequency Shift Keying (BFSK). The oscillator 204 may include a bank or an array of switched capacitors, which may be used to adjust the load capacitance of the oscillator 204. As explained above, adjusting the load capacitance of the oscillator 204 may adjust the oscillation frequency. The digital data signal, indicative of digital "0" and "1," may be used to modify the load capacitance of the oscillator 204, such that the oscillator 204 may generate a modulated signal of two frequencies, one of which corresponds to digital "0" and the other to digital "1."

The modulated RF signal, carrying the data signal, may be transmitted to a power amplifier 206 as illustrated in FIG. 2. In this example, the power amplifier is a class-D power amplifier, however, any suitable power amplifier may be used according to various examples. However, also note that at least a portion of the modulated signal may be transmitted to a prescaler 208. The prescaler 208 may scale the signal and provide the scaled signal to the BLE packetizer 202, where it may be used as a clock source. For instance, the prescaler 208 may scale down the 2.48 GHz signal to a 1 MHz or 8 MHz signal. By using a portion of the carrier signal as a clock source for the BLE packetizer 202, there may be no need for a separate timing source for the BLE packetizer 202, thereby further increasing power savings.

Furthermore, as illustrated in FIG. 2, the modulated RF carrier signal may be amplified using the class-D power amplifier 206. The amplified signal may then be transmitted to the antenna (represented as "RF" in FIG. 2) where it may be broadcast over the air. As explained above, in some examples, a BLE module may be operating in an advertising mode, which involves the BLE module periodically transmitting advertising packets. Accordingly, the broadcast RF signal may include advertisement packets, which may be received by one or more Bluetooth devices.

A BLE module may be powered by the powertrain 210. The powertrain may include a low dropout regulator (LDO) 228, a power on reset (PoR) 222, a bandgap voltage reference (Bandgap) 226, and a real-time clock (RTC) 224. Note that the RTC 224 may have a low frequency and may operate without a crystal reference, as the BLE packetizer 202 may use a signal from the oscillator 204 as explained above.

Figure 4A:
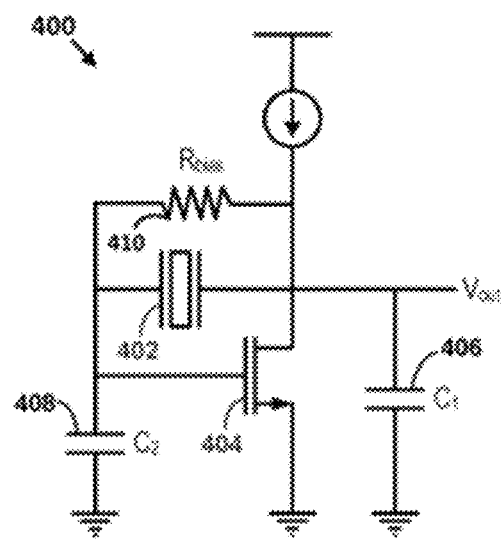
FIGS. 4A, 4B, and 4C illustrate oscillators according to examples.
Figure 4B:
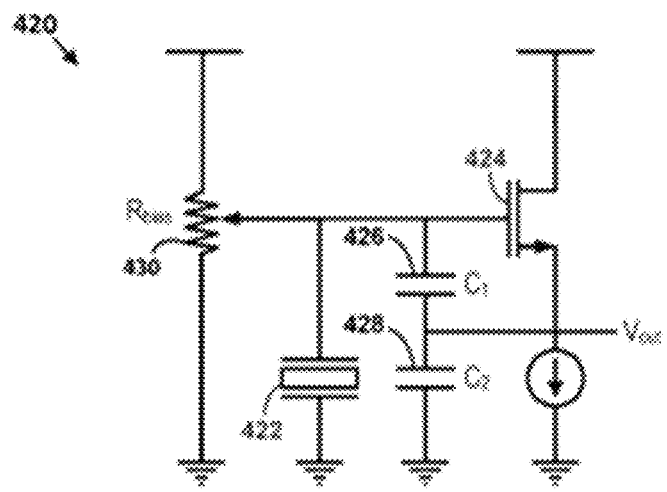

FIGS. 4A and 4B illustrate example oscillator circuits for use in a BLE module. For example, the example oscillator circuits depicted in FIGS. 4A and 4B may serve as oscillator 204 in the BLE transmitter 200 depicted in FIG. 2, which may or may not operate in the connectable configuration (e.g., capable of pairing with another Bluetooth device) and/or the scannable configuration (e.g., broadcasting an advertising packet in response to receiving a scan request from another Bluetooth device).

In particular, FIG. 4A illustrates a Pierce oscillator circuit 400. The Pierce oscillator circuit 400 may include a resonator 402, a transistor 404, capacitors C1 406 and C2 408, and a biasing resistor 410. As discussed above with respect to FIG. 2, the resonator 402 may be an FBAR resonator that oscillates at an RF frequency. In other examples, the resonator may be any resonator that may be a high frequency resonator, which may provide an oscillation frequency with a stability and an accuracy that may meet Bluetooth standards, such as a crystal resonator. While the transistor 404 is depicted in FIG. 4A as a metal-oxide-semiconductor field-effect transistor (MOSFET), the transistor 404 may be any type of amplifying transistor. In some examples, the transistor 404 may include more than one transistor and/or may take the form of an operational amplifier.

As depicted in FIG. 4A, a Pierce oscillator circuit includes a pi-network feedback circuit arrangement. In this arrangement, one terminal of the resonator 402 is connected to capacitor C1 406, and the other terminal of the resonator 402 is connected to capacitor C2 408, while capacitors C1 406 and C2 408 are coupled to ground. In operation, the FBAR resonator 402 may appear inductive at frequencies different from its resonant frequency, and the oscillation frequency of the FBAR resonator 402 may be adjusted by varying its load capacitance. Accordingly, by varying the capacitance of capacitors C1 406 and C2 408 the load capacitance of the FBAR resonator 402 may be varied, and, consequently, the oscillation frequency of the Pierce oscillator circuit 400 may be varied as well.

As noted above with respect to FIG. 2, the data signal generated by the BLE packetizer 202 may act as a tuning code that may be used to directly modulate an RF signal generated by the Pierce oscillator circuit 400, such that the modulated RF signal may carry the data signal generated by the BLE packetizer 202. Within examples, the tuning code may modulate the RF signal generated by the Pierce oscillator circuit 400 according to at least BLE protocols.

For instance, the tuning code may be used to modulate the RF signal to two different frequencies of the same advertising channel according to GFSK. Additionally and/or alternatively, the tuning code may be used to modulate the RF signal to two different frequencies of the same advertising channel according to BFSK. In some examples, the capacitors C1 406 and C2 408 may each represent a bank of switched capacitors, which may be used to adjust the load capacitance of the FBAR resonator 402. As explained above, adjusting the load capacitance of the FBAR resonator 402 may adjust the oscillation frequency of the Pierce oscillator circuit 400. The digital data signal, indicative of digital "0" and "1," may be used to modify the load capacitance of the FBAR resonator 402, such that the Pierce oscillator circuit 400 may generate a modulated signal of two frequencies, one of which corresponds to digital "0" and the other to digital "1."

FIG. 4B illustrates a Colpitts oscillator circuit 420. Similar to the Pierce oscillator circuit 400, the Colpitts oscillator circuit 420 may include a resonator 422, a transistor 424, capacitors C1 426 and C2 428, and a biasing resistor 430. As discussed above with respect to FIG. 2, the resonator 422 may be an FBAR resonator that oscillates at an RF frequency. In other examples, the resonator may be any resonator that may be a high frequency resonator, which may provide an oscillation frequency with a stability and an accuracy that may meet Bluetooth standards, such as a crystal resonator. While the transistor 424 is depicted in FIG. 4B as a MOSFET, the transistor 424 may be any type of amplifying transistor. In some examples, the transistor 424 may include more than one transistor and/or may take the form of an operational amplifier.

As depicted in FIG. 4B, a Colpitts oscillator circuit 420 includes a capacitive voltage divider feedback circuit arrangement. In this arrangement, capacitors C1 426 and C2 428 are coupled in series to form a voltage divider. One terminal of the resonator 422 is connected to the transistor 424, and the other terminal of the resonator 422 is connected to ground. In operation, the FBAR resonator 422 may appear inductive at frequencies different from its resonant frequency, and the oscillation frequency of the FBAR resonator 422 may be adjusted by varying its load capacitance. Accordingly, by varying the capacitance of capacitors C1 426 and C2 428 the load capacitance of the FBAR resonator 422 may be varied, and, consequently, the oscillation frequency of the Colpitts oscillator circuit 420 may be varied as well.

As noted above with respect to FIG. 2, the data signal generated by the BLE packetizer 202 may act as a tuning code that may be used to directly modulate an RF signal generated by the Colpitts oscillator circuit 420, such that the modulated RF signal may carry the data signal generated by the BLE packetizer 202. Within examples, the tuning code may modulate the RF signal generated by the Colpitts oscillator circuit 420 according to at least BLE protocols.

For instance, the tuning code may be used to modulate the RF signal to two different frequencies of the same advertising channel according to GFSK. Additionally and/or alternatively, the tuning code may be used to modulate the RF signal to two different frequencies of the same advertising channel according to BFSK. In some examples, the capacitors C1 426 and C2 428 may be a bank of switched capacitors, which may be used to adjust the load capacitance of the FBAR resonator 422. As explained above, adjusting the load capacitance of the FBAR resonator 422 may adjust the oscillation frequency of the Colpitts oscillator circuit 420. The digital data signal, indicative of digital "0" and "1," may be used to modify the load capacitance of the FBAR resonator 422, such that the Colpitts oscillator circuit 420 may generate a modulated signal of two frequencies, one of which corresponds to digital "0" and the other to digital "1."

Figure 4C:
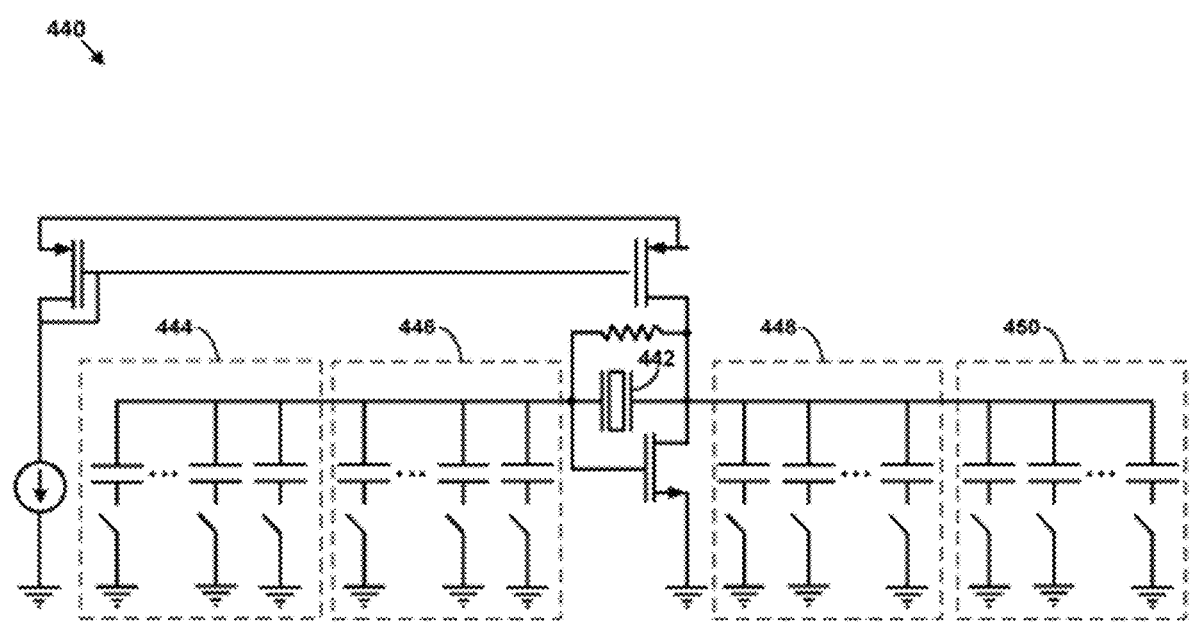

FIG. 4C illustrates an oscillator circuit 440 that includes four capacitor arrays (which are represented in FIG. 4A as capacitors 406 and 408, and in FIG. 4B as capacitors 426 and 428). In an example, two capacitor arrays may be "right" capacitor arrays that are connected to the right side of the FBAR 442. Further, the other two capacitor arrays may be "left" capacitor arrays that are connected to the left side of the FBAR 442. For example, the capacitor arrays 444 and 446 may be right capacitor arrays, and the capacitor arrays 448 and 450 may be left capacitor arrays. Further, two of the capacitor arrays may be fine capacitor arrays, and two of the capacitor arrays may be coarse capacitor arrays. For example, the capacitor arrays 444 and 448 may be fine capacitor arrays, and the capacitor arrays 446 and 450 may be coarse arrays.

In an example, the coarse capacitor arrays 446 and 450 may have a larger tuning step than the fine capacitor arrays 444 and 448. For example, coarse capacitor arrays 446 and 450 may have a tuning step of 40 ppm and fine capacitor arrays may have a tuning step of 5 ppm. Further, the coarse capacitor arrays 446 and 450 may have a larger tuning range than the fine capacitor arrays 444 and 448. For example, coarse capacitor arrays 446 and 450 may have a tuning range of 1400 ppm and fine capacitor arrays 444 and 448 may have a tuning range of 700 pm. As such, the coarse capacitor arrays 446 and 450 may be switched on or off to quickly tune the frequency of the signal generated by the FBAR to a frequency near the target frequency (e.g., 2.402 GHz, 2.480 GHz, or 2.426 GHz). The fine capacitor arrays 444 and 448 may be switched on or off to tune the frequency of the signal generated by the FBAR to the target frequency.

Note that the example oscillator circuits provided in FIGS. 4A, 4B, and 4C and the accompanying description herein is for illustrative purposes only and should not be considered limiting. For instance, the oscillator circuits may include additional and/or alternative components than depicted. Further, Pierce and Colpitts oscillator circuits may take various forms, and the BLE devices described herein should not be limited to the depicted oscillator circuit configurations. For example, in some examples, the Colpitts oscillator circuit 420 may include a bipolar junction transistor (BJT) arranged in a common base configuration.

In some examples, an oscillator, such as oscillator 204 of BLE transmitter 200 depicted in FIG. 2, may include three Pierce oscillator circuits 400, each of which may be used to generate a carrier signal at a frequency of one of the three BLE channels. In some examples, an oscillator, such as oscillator 204 of BLE transmitter 200 depicted in FIG. 2, may include three Colpitts oscillator circuits 420, each of which may be used to generate a carrier signal at a frequency of one of the three BLE channels.

In examples where the BLE transmitter 200 includes more than one of the Pierce oscillator circuits 400 or Colpitts oscillator circuits 420, the BLE transmitter 200 may modulate each of the RF carrier signals generated by the Pierce oscillator circuits 400 or Colpitts oscillator circuits 420 to carry the data signal generated by the BLE packetizer 202. In this manner, the data signal generated by the BLE packetizer 202 may be concurrently broadcast on each of the RF carrier signals. In one example, the data signal generated by the BLE packetizer 202 may be concurrently broadcast on all three BLE channels.

In other examples where the BLE transmitter 200 includes more than one of the Pierce oscillator circuits 400 or Colpitts oscillator circuits 420, the BLE transmitter 200 may modulate one or two of the RF carrier signals generated by the Pierce oscillator circuits 400 or Colpitts oscillator circuits 420 to carry the data signal generated by the BLE packetizer 202. In this manner, the data signal generated by the BLE packetizer 202 may be broadcast on only one of the three BLE channels or concurrently broadcast on two of the three BLE channels.

Still in other examples where the BLE transmitter 200 includes more than one of the Pierce oscillator circuits 400 or Colpitts oscillator circuits 420, the BLE transmitter 200 may employ time division multiplexing (TDM) to modulate the RF carrier signals generated by the Pierce oscillator circuits 400 or Colpitts oscillator circuits 420 to carry the data signal generated by the BLE packetizer 202. In this manner, the data signal generated by the BLE packetizer 202 may be carried on a first RF signal (e.g., a 2.402 GHz signal) for a given amount of time, then carried on a second RF signal (e.g., a 2.480 GHz signal) for a given amount of time, and then carried on a third RF signal (e.g., a 2.426 GHz signal) for a given amount of time. Note that, in some examples, TDM may be used to carry the data signal on more or fewer than three RF signals.

As noted, reducing the size and power consumption of a BLE module allows for longer operation and more versatile applications and/or uses. Accordingly, it may be advantageous to generate multiple carrier signals with a single oscillator circuit.

In one illustrative example, a Bluetooth Low Energy (BLE) transmitter provides power savings compared to traditional Bluetooth transmitters by using a free-running oscillator (such as a Pierce oscillator with an FBAR) to generate an RF signal instead of a crystal oscillator and phase lock loop (PLL). Thus, in some examples, the BLE transmitter has an FBAR oscillator, does not have a crystal oscillator and does not have a PLL.

An FBAR oscillator has a tuning range/power consumption trade-off that can result in a power penalty as operating temperature range is widened. Widening the operating temperature range of a transmitter having an FBAR oscillator thus results in an increased tuning range requirement, and thus increases the amount of power needed to tune the FBAR to the desired frequency. However, techniques described herein may reduce the required tuning range of the FBAR oscillator. To illustrate the issue, tuning ranges for an FBAR across several temperature ranges according to one example are shown below in Table 1.

TABLE 1

| $T_{min}$ (C) | $T_{max}$ (C) | Exemplary Required Tuning Range (ppm) |
| --- | --- | --- |
| 0 | 70 | 231 |
| 0 | 85 | 306 |
| −20 | 105 | 462 |

Figure 5:
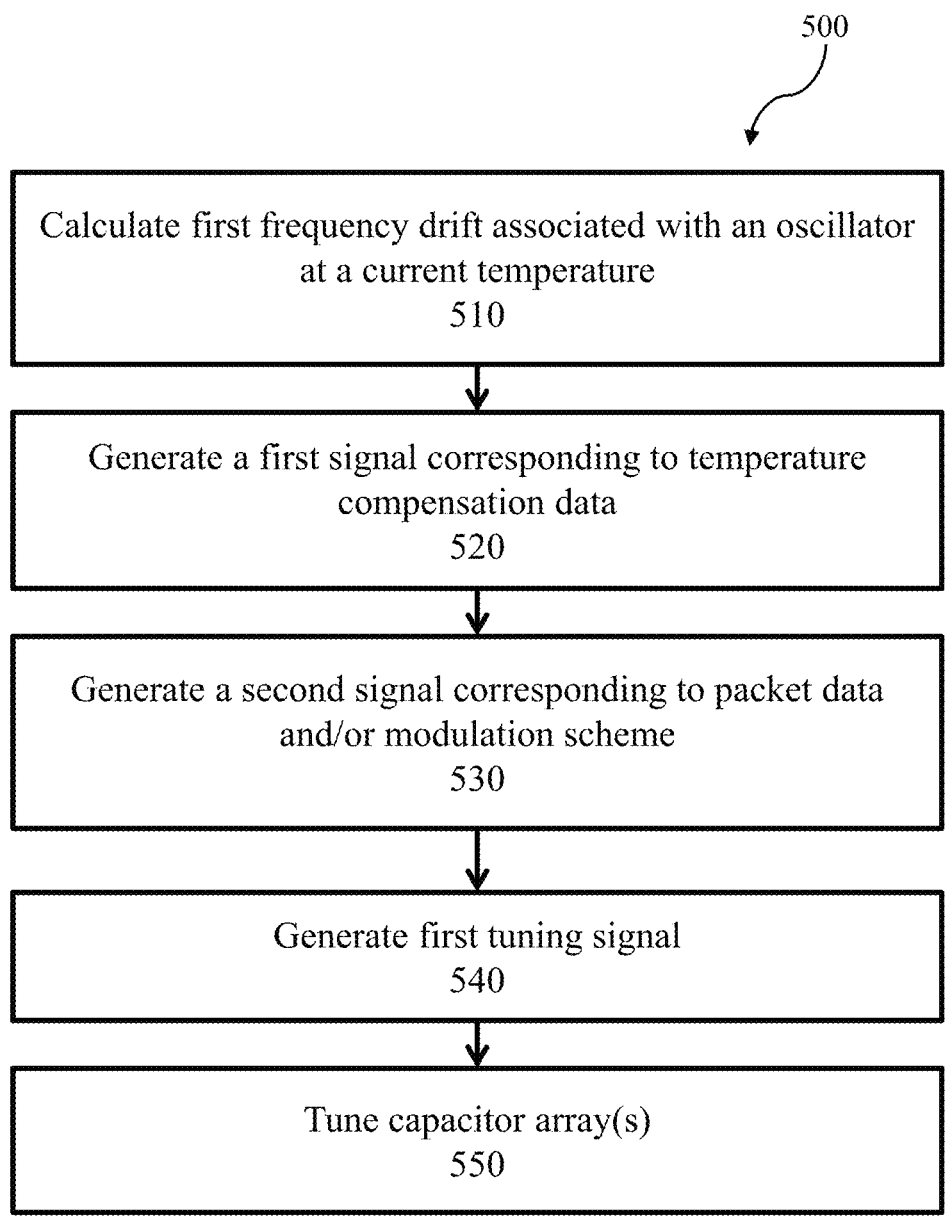
FIG. 5 shows an example method of temperature compensation according to an example.

Referring now to FIG. 5, this figure shows an example method 500 of temperature compensation for an FBAR-based BLE transmitter. Method 500 may be performed any suitable device according to this disclosure. For example, method 500 can be performed by a transmitter or any Bluetooth device described herein. In some examples, method 500 may be performed by a Bluetooth beacon, such as beacon 102, and/or a transmitter, such as BLE transmitter 200, to facilitate compensation of a temperature coefficient of a resonator.

In one example, method 500 may be carried out by the beacon 102 to facilitate compensation of the temperature coefficient (TC) of the resonator. As such, method 500 may compensate for the effects of temperature on the oscillator 204 and/or on other components of the BLE transmitter 200. Within examples, the oscillator 204 may be one or more of the oscillator circuits described in relation to FIG. 4A, 4B, 4C, or 14. Accordingly, one or more Pierce oscillator circuits with one or more FBAR resonators may generate the RF signals.

Figure 10:
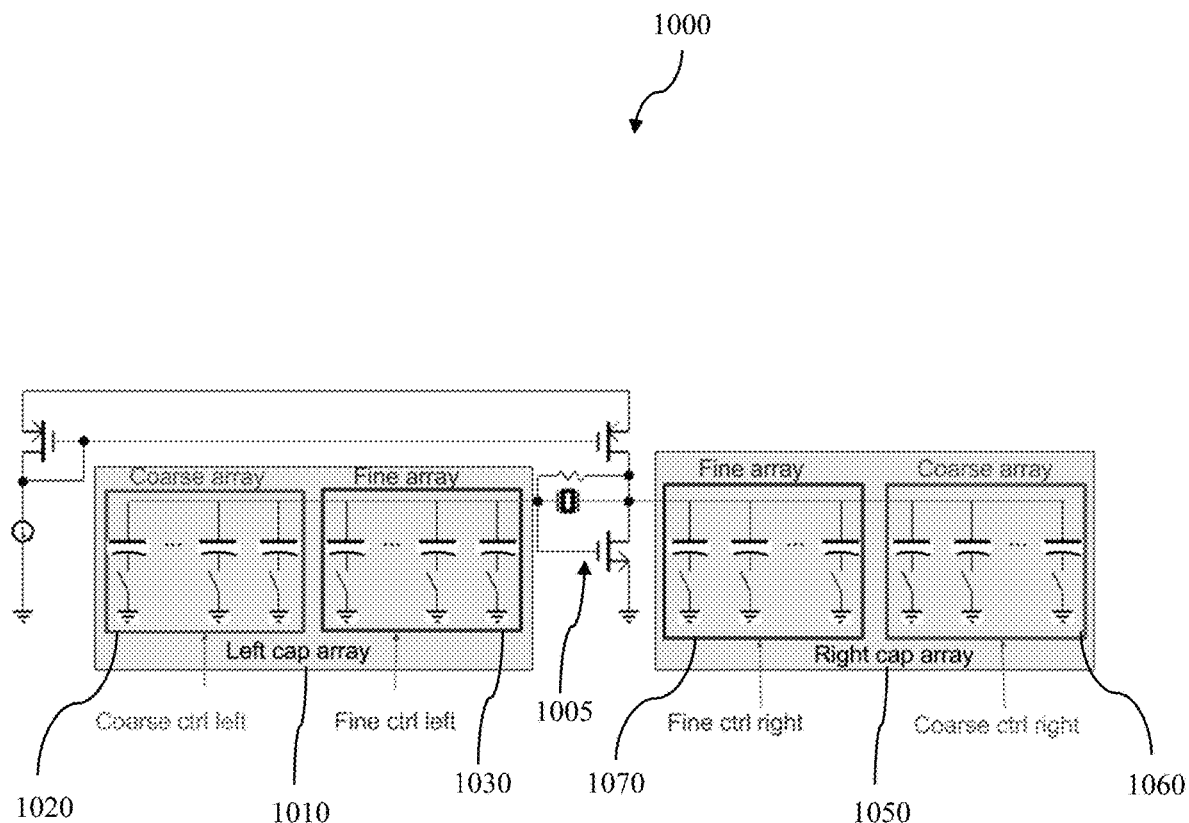
FIG. 10 shows an example Pierce oscillator with a split capacitor array according to an example.

In examples, method 500 compensates for the effects of temperature on an oscillator, such as the Pierce oscillator described herein with respect to FIG. 10. In some examples, method 500 compensates for the effects of temperature on an oscillator, such as an oscillator described herein, and/or other components of a transmitter, such as components of BLE transmitter 200. In some examples, the oscillator is one or more of the oscillator circuits described with respect to FIG. 4A, 4B, or 4C. In some examples, the oscillator is a Pierce oscillator with a split capacitor array, such as the Pierce oscillator shown herein in FIG. 10. In examples, one or more Pierce oscillator circuits with one or more FBAR resonators may generate RF signals.

Method 500 is described as being performed by a BLE transmitter using one or more BLE protocols. In particular, method 500 may be carried out or implemented by one or more of devices, such as the Bluetooth devices described herein. For example, the method 500 may be carried out by the beacon 102 to facilitate compensation of the temperature coefficient (TC) of the resonator. As such, the method 500 may compensate for the effects of temperature on the oscillator 204 and on other components of the BLE transmitter 200. Within examples, the oscillator 204 may be one or more of the oscillator circuits described in relation to FIGS. 4A, 4B, and 4C. Accordingly, one or more Pierce oscillator circuits with one or more FBAR resonators may generate the RF signals. In various examples, method 500 may be performed by other devices and/or using other protocols.

In some examples, method 500 is performed by packetizer 202 of beacon 102. The packetizer 202 may generate a tuning signal that may be indicative of packet data and a modulation scheme. Such a tuning signal may be used to tune oscillator 204 such that the oscillator 204 generates a modulated RF signal oscillating at or near a target frequency. In some examples, packetizer 202 may perform at least part of method 500 such that a tuning signal generated by packetizer 202 is indicative of a modulation scheme, packet data, and/or a temperature compensation signal. In examples, temperature can affect the performance of BLE transmitter 200 and packetizer 202 can generate a tuning code that may be used to tune oscillator such that oscillator 204 generates a modulated RF signal with a frequency at or near a target frequency.

In block 510 of method 500, a first frequency drift is calculated. In one example, the first frequency drift corresponds to an oscillator at a current temperature. The current temperature may be measured by a temperature sensor in beacon 102.

In one example, the first frequency drift may be a quadratic approximation of a frequency drift of an oscillator at a current temperature. The frequency drift may be indicative of the frequency drift due to the effect of temperature on the resonator and/or the components of the BLE transmitter 200. The quadratic approximation of the frequency drift may be calculated according to the following formula:

$$f(T)=f(\text{TOT})-\beta(T-\text{TOT})^2$$

In this approximation, the linear term is a function of the turnover temperature (TOT) of the resonator. T is the current temperature and β the gain coefficient. The turnover temperature (TOT) may be the temperature at which the oscillator is operable to generate its highest frequency. In an example, TOT and β may be received from one or more registers of the processor or from the memory of beacon 102. TOT and β may be predetermined using a calibration technique described herein.

In examples, an additional linear term is provided to help enable support of a wider range of temperature non-idealities. For example, in one example, a first frequency drift corresponding to an oscillator at a current temperature is determined according to the following formula:

$$f(T)=f(\text{TOT})-\alpha(T-T_{shift})-\beta(T-T_{shift})^2$$

In this formula, T is a current temperature corresponding to an oscillator, TOT is a turnover temperature corresponding to a resonator, α is a positive or negative linear term, $T_{shift}$ is a temperature shift, and β is a gain coefficient. In an example, TOT, α, and/or β may be received from one or more registers of the processor or from the memory of beacon 102. TOT, α, and/or β may be predetermined using a calibration technique described herein. Moreover, as shown in the formula above, frequency drift estimation for temperature compensation can be based on a linear term as a function of temperature and/or a second order term as a function of temperature.

In examples, the turnover temperature (TOT) is the temperature at which the oscillator is operable to generate its highest frequency. In examples, the turnover temperature (TOT), positive or negative linear term (α), temperature shift ($T_{shift}$), and/or the gain coefficient (β) is received from one or more registers of a processor and/or from a memory in a transmitter. In some examples, the turnover temperature (TOT), positive or negative linear term ($T_{shift}$), temperature shift ($T_{shift}$), and/or the gain coefficient (β) are predetermined using a calibration method, such as a calibration method described herein. For example, compensation parameter(s) used in method 500 may be determined using calibration method 600 described herein with respect to FIG. 6. Such predetermined parameters may be referred to herein as "compensation parameters."

In examples, the current temperature (T) is measured by a temperature sensor. For example, a CMOS temperature sensor in a transmitter (such as BLE transmitter 200) can measure the current temperature. In examples, a temperature compensation module (such as a temperature compensation module in packetizer 202) calculates the first frequency drift. For example, the temperature compensation module may determine a first frequency drift of an RF signal that could be generated by an oscillator at the current temperature.

In examples, a transmitter (such as BLE transmitter 200) periodically turns on to transmit a signal which may include an advertisement packet. In some of these examples, an oscillator in the transmitter may generate an RF signal during period(s) when the transmitter is turned on to transmit the signal. In some examples, a temperature compensation module calculates the first frequency drift while the oscillator is on. In other examples, a temperature compensation module calculates the first frequency drift while the oscillator is off. In some of these examples, the temperature compensation module can calculate the first frequency drift based on an RF signal that the oscillator would be capable of generating if the oscillator was on.

In examples, the first frequency drift corresponds to a frequency drift due to the effect of temperature on component(s) of BLE transmitter 200. For example, the first frequency drift can correspond to the effect of temperature on a resonator and/or other components in a transmitter.

Referring back to method 500, in block 520 a first signal corresponding to temperature compensation data is generated. In some examples, such a first signal may be referred to herein as a temperature compensation signal. In examples, the first signal is based at least in part on the first frequency drift calculated in block 510. For example, a temperature compensation module may generate a temperature compensation signal to compensate for the effect of temperature on the performance of beacon 102. The temperature compensation signal may depend on the first frequency drift.

In one example, the temperature compensation signal is configured to cause oscillator 204 to generate a frequency within a threshold of a target frequency. For example, the threshold may be a ±5 ppm difference between a frequency that could be generated by the oscillator at the current temperature and the target frequency. In examples, a temperature compensation signal is determined according the following formula:

$$TC = \frac{-\beta * (D_{temp} - TOT)^2}{2^{26}}$$

where β is a gain coefficient, TOT is a turnover temperature corresponding to a resonator, and $D_{temp}$ is the current temperature measured from a temperature sensor.

Referring back to method 500, in block 530 a second signal corresponding to packet data and/or a modulation scheme is generated. In some examples, such a second signal may be referred to herein as a data modulation signal. In some examples, packet data is received by packetizer 202 from a Host Controller Interface (HCI). For example, a serializer in packetizer 202 may receive packet data from the HCI. In some examples, the serializer generates a bitstream corresponding to the packet data. The process of converting packet data into a bit stream may be referred to as serialization. In examples, a whitener may receive the bit stream generated by a serializer and can whiten the bit stream (such as by introducing a pseudorandom element into the bit stream which may improve the balance of 0 bits and 1 bits of the bit stream).

A Gaussian Frequency Shift Keying (GFSK) module may receive the whitened bit stream from the whitener. The GFSK module may filter the bit stream using a Gaussian filter. In one example, parameters of the Gaussian filter can be set according to a GFSK modulation scheme specified in a Bluetooth and/or BLE core specification.

A multiply module can receive the filtered bit stream from the GFSK module. The multiply module may also receive a signal "DELTA (Δ)." Δ may be received from one or more registers of a processor or from a memory of beacon 102. Δ may be a predetermined code indicative of a frequency deviation between two frequencies of a GFSK modulation scheme. Δ can be a compensation parameter determined using a calibration process. The multiply module may multiply the filtered bit stream by Δ to set a frequency deviation between the frequency associated with the 0 bits and the frequency associated with the 1 bits of the bit stream. For example, the frequency deviation may be 200 ppm. As such an output signal of the multiply module may be indicative of the modulation scheme and the packet data. In one example, the output of the multiply module may be:

$$\text{Multiply}_{Output} = \text{GFSK}_{Output} * \Delta$$

In this example, the output can be the second signal of block 540.

Referring back to method 500, in block 540 a first tuning signal is generated. In examples, the first tuning signal is based at least in part on the first signal and the second signal. In some examples, the first tuning signal is based on the first signal, the second signal, and/or a predetermined signal.

A sum module may receive the first signal corresponding to temperature compensation data, the second signal corresponding to packet data and/or a modulation scheme, and the predetermined signal. The predetermined signal may be an offset signal corresponding to an offset for one or more capacitor arrays. The predetermined signal that can be retrieved from one or more registers or from a memory of beacon 102. In one example, the predetermined signal can be a compensation parameter determined using a calibration processor. In examples, the predetermined signal can correspond to one or more offsets associated with one or more fine capacitor arrays (such as fine capacitor array 1030 and/or fine capacitor array 1070 in FIG. 10).

In examples, the first tuning signal corresponds to a modulation scheme, packet data, a temperature compensation signal, and/or a fine capacitor offset for a fine capacitor array. The fine capacitor offset may be determined using a calibration method.

In examples, the first tuning signal can be generated at least in part by combining the temperature compensation signal and the data modulation signal. For example, the temperature compensation signal and the data modulation signal may be added together, such as in the digital domain or in the capacitance domain.

Referring back to method 500, in block 550 one or more capacitor array(s) are tuned. For example, the first tuning signal generated in block 540 can be output to one or more capacitor arrays to tune the capacitor arrays. The capacitor array may be coupled to the oscillator.

In some examples, more than one tuning signal can be output to various capacitor arrays. For example, a first tuning signal may be output to a first capacitor array coupled to an oscillator to tune the first capacitor array and a second tuning signal is output to a second capacitor array coupled to the oscillator to tune the second capacitor array. As another example, referring to FIG. 10, a first tuning signal may be output to a first fine capacitor array 1030 and/or a second fine capacitor array 1070, and a second tuning signal can be output to a first coarse capacitor array 1020 and/or a second coarse capacitor array 1060. In one example, a first tuning signal is output to fine capacitor array 1030, a second tuning signal is output to fine capacitor array 1070, a third tuning signal is output to coarse capacitor array 1020, and a fourth tuning signal is output to coarse capacitor array 1060.

A tuning signal output to a fine capacitor array may correspond to at least a temperature compensation signal (which may have temperature compensation data) and a data modulation signal (which may have packet data and/or a modulation scheme) in various examples. A tuning signal output to a coarse capacitor array may be configured to process tune the coarse capacitor array. For example, a tuning signal to a coarse capacitor array can be configured to tune the coarse capacitor array to compensate for process variations.

In some examples, the oscillator generates a modulated RF signal that has a second frequency drift that is less than a threshold after the capacitor array(s) have been tuned. The modulated RF signal can correspond to packet data. In one example, the threshold of the second frequency drift may be ±5 ppm. Other thresholds can be used in various examples.

Figure 6:
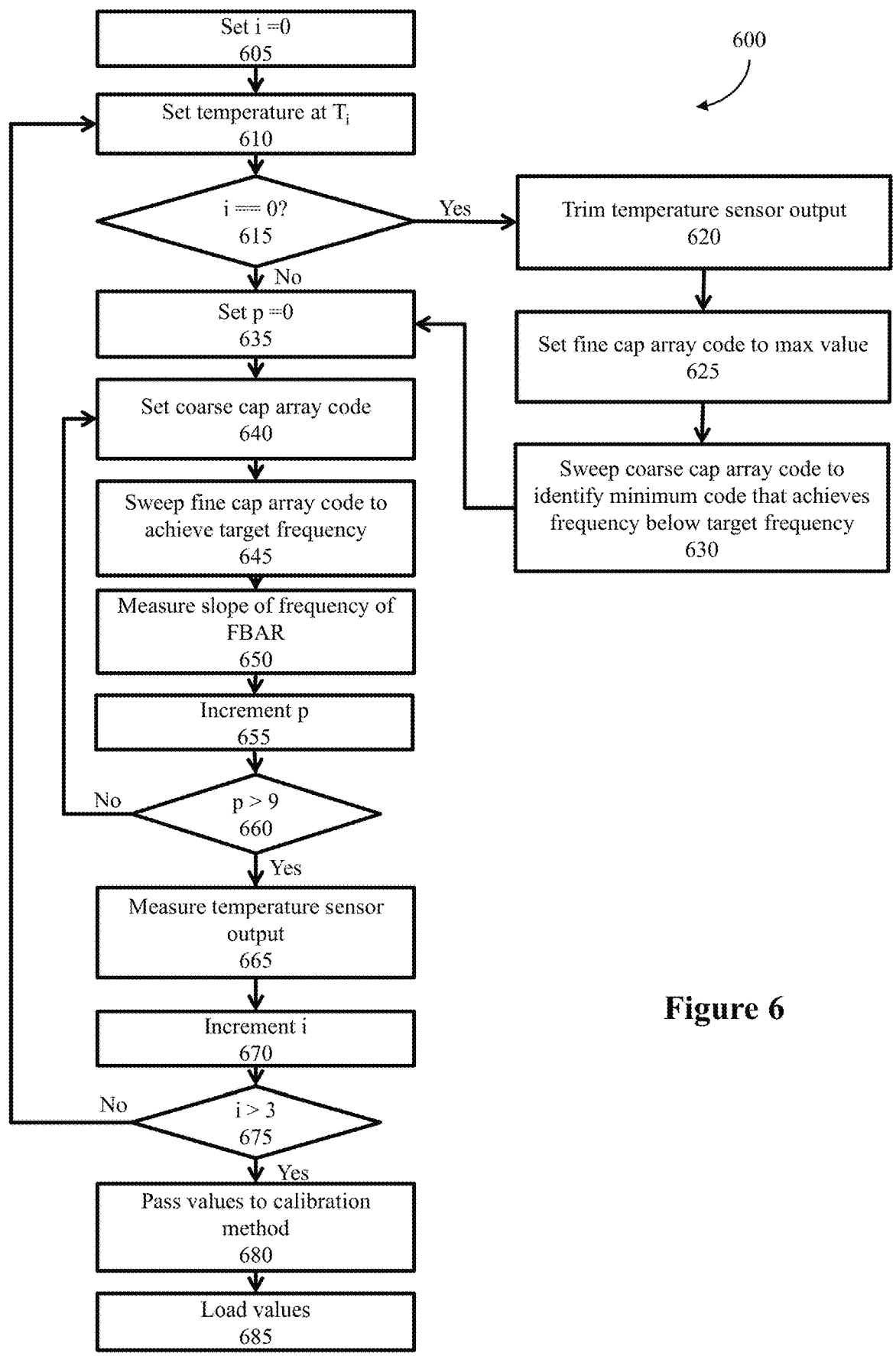
FIG. 6 shows an example method of calibrating a device according to an example.

Referring now to FIG. 6, this shows an example method 600 of calibrating a device according to an example. Method 600 may be performed one or more devices, such as a transmitter. For example, method 600 may be performed by a Bluetooth Low Energy (BLE) transmitter.

In examples, method 600 is used to determine compensation parameters for a device. For example, method 600 may be performed to determine compensation parameters used to calibrate one or more devices, such as the Bluetooth devices described herein. In some examples, testing and/or calibration equipment can be used to perform at least some of the steps of method 600 to calibrate one or more beacons.

For example, in order to measure the frequency of an RF signal generated during a calibration process, an off-chip instrument such as a spectrum analyzer, a high-speed oscilloscope, and/or a high-speed frequency counter may be used. Moreover, a temperature chamber that can reach calibration temperatures can be used to change the temperature of a transmitter in order to measure parameters of the transmitter at the calibration temperatures. For example, the temperature chamber can reach temperatures between a first temperature and a second temperature. In one example, the first temperature is 0° C. and the second temperature is 70° C. In another example, the first temperature is 0° C. and the second temperature is 85° C. In another example, the first temperature is −20° C. and the second temperature is 85° C. In yet another example, the first temperature is −20° C. and the second temperature is 105° C.

In examples, the temperature chamber must be configured to reach below at least a minimum temperature and configured to reach above at least a maximum temperature. In one example, a temperature chamber is accurate to within 0.25° C. of the calibration temperatures used in method 600. In another example, a temperature chamber is accurate to within 1° C. of the calibration temperatures used in method 600. In one example, the calibration temperature that are used in method 600 are between −20° C. and 85° C. In some examples, a time series measurement of the chamber temperature and of a transmitter's temperature may be used to determine whether the temperatures of the chamber and of the transmitter have stabilized. Further, a transmitter that is calibrated may be connected to a computing device that may be used to provide calibration instructions to the transmitter. Also, although the method 600 is described herein as calibrating a BLE transmitter, method 600 may also be carried to calibrate other types of devices.

Referring back to FIG. 6, in block 605 of method 600 a loop variable for temperature is set. For example, a loop variable i is set to 0 in one example.

In block 610, a temperature is set. For example, a temperature corresponding to loop variable i is set in one example. In this example, a temperature for $T_i$ is set. Accordingly, in examples, if i is 0 then a temperature is set for $T_0$, if i is 1 then a temperature is set for $T_1$, and if i is 2 then a temperature is set for $T_2$. In one example, temperatures are set at −20° C., 25° C., and 50° C. For example, $T_0$ may be set to −20° C. when i is 0, $T_1$ may be set to 25° C. when i is 1, and $T_2$ may be set to 50° C. when i is 2. In various examples, $T_i$ can be set to any suitable temperature.

In block 615, a determination is made as to whether the current value for the loop variable for temperature is equal to the initial value set for the loop variable. For example, if loop variable i is set to 0 in block 605, then a determination is made as to whether loop variable i is currently set to block 0 in block 615. Thus, in examples, a determination is made as to whether loop variable i in block 615 equals the value set for loop variable i in block 605.

In examples, in block 615, if the current value for the loop variable for temperature is equal to the initial value set of the loop variable, then method 600 proceeds to block 620. Otherwise, method 600 proceeds to block 635. For example, in one example, if loop variable i is set to 0 in block 615 then method 600 proceeds to block 620, and if loop variable i is not set to 0 in block 615 then method 600 proceeds to block 635.

If a determination is made to proceed to block 620, in block 620 a temperature sensor output is trimmed. For example, a temperature sensor can have an analog trim that adjusts a 0-code absolute temperature intercept. In this example, an ideal temperature sensor code may be determined as a function (e.g., a linear function) of $T_i$ and $T_{ideal\_offset}$.

In one example, a temperature sensor reading is triggered while a temperature sensor offset is swept until a value is greater than an ideal temperature sensor value. For example, a temperature sensor offset control register can be swept starting from 0 and a temperature sensor reading can be triggered until a digital code read from a temperature sensor data register is greater than an ideal temperature sensor value.

In block 625, a fine capacitor array code is set to a maximum value. For example, in one example, if the maximum offset for a fine capacitor array is 255, then the offset for the fine capacitor array is set to 255.

In block 630, a minimum code that achieves a frequency below a target frequency is identified by sweeping coarse capacitor array codes (e.g., changing through a plurality of coarse capacitor array codes). The minimum code may be referred to herein as CC_MIN. CC_MIN can correspond to a minimum coarse capacitor array code to set a bound for the calibration method.

In one example, in order to increase usage of the fine-tuning range across the operating temperature range, the measurement of the coarse tuning capacitor across temperatures requires multiple measurements. In examples, before TOT is determined, CC_MIN is determined as the coarse code which satisfies the modulation frequency delta while the fine-tuning capacitor is increased.

In one example, CC_MIN is the coarse tuning code at $T_0$, when a register corresponding to a fine oscillator offset is set to the maximum value which results in a measured frequency 200 ppm less than a target carrier frequency.

In block 635, a loop variable for coarse capacitor array code is set. For example, a loop variable p is set to 0 in one example.

In block 640, a coarse capacitor array code is set. For example, the coarse capacitor array code is set to $CC_p$=CC_MIN+p according to one example. In this example, $CC_p$ corresponds to the coarse capacitor array code for loop index p.

In block 645, a fine capacitor array code is identified by sweeping fine capacitor array codes to identify a fine capacitor array code that achieves a target frequency. A fine capacitor array code for loop index i and loop index p may be referred to herein as $FC_{i,p}$. In this example, fine tuning code $FC_{i,p}$ corresponds to temperature $T_i$ and coarse tuning code $CC_p$.

In examples, $FC_{i,p}$ corresponds to a fine-tuning code that reduces frequency offset at temperature $T_i$ and coarse code setting $CC_p$. Sweeping the fine-tuning offset can reduce error to the target frequency. In one example, the sweep is a binary search to identify a fine capacitor array code that achieves a target frequency. In another example, the sweep involves calculating a best guess and verifying based on an ideal frequency tuning least significant bit (LSB) and/or measured frequency tuning slope for that coarse offset setting.

In block 650, a slope of frequency of a resonator, such as an FBAR in this example, is measured. A slope of frequency measured for loop index i and loop index p may be referred to herein as $f_{slope\ i,p}$. In examples, $f_{slope\ i,p}$ corresponds to the slope of the FBAR frequency with respect to the fine capacitor array code (in ppm/code) at temperature $T_i$ for a coarse capacitor array code setting $CC_p$.

In examples, the slope of frequency of the resonator (an FBAR in this example) is measured by incrementing an offset of a fine capacitor array by a number of nodes. For example, osc_offset_fine is incremented from a current value $FC_{i,p}$ by n nodes according to various examples. In one example, n is 10. In other examples, n can be any number of suitable values.

In examples, $f_{slope\ i,p}$ can be measured using the following formulas:

$$f_{slope\ i,p}=(f_2-f_1)/n$$

where
$f_2$=FBAR frequency deviation from target frequency (in ppm) at the fine offset $FC_{i,p}$+n
$f_1$=FBAR frequency deviation from target frequency (in ppm) before incrementing (i.e. at fine oscillator offset $FC_{i,p}$)

In some examples, after measuring $f_{slope\ i,p}$ the fine offset for the oscillator is decremented. For example, the fine offset for the oscillator can be decremented by n.

In block 655 the current value for the loop variable for coarse capacitor array code is incremented. For example, the current value for the loop variable for coarse capacitor array code p can be incremented by 1 according to an example. Thus, in this example, if p is 4 in block 650, then p is incremented by 1 to set p at 5 in block 655. In various examples, p can be incremented or decremented by any suitable value.

In block 660, a determination is made as to whether the current value for the loop variable for coarse capacitor array code is above a threshold. For example, if loop variable for coarse capacitor array code p is less than a threshold value of 9, then in one example method 600 returns to block 640. In this example, if p is not less than 9, then method 600 proceeds to block 660. Thus, in an example where p is set to 0 in block 635, p is incremented by 1 in block 655, and a determination is made as to whether p is less than 9 in block 660, method 600 loops from block 640 through block 660 ten times for each temperature $T_1$ set in block 610. The threshold can be any suitable value in various examples. While block 660 is described with respect to making a determination as to whether the loop variable coarse capacitor array code is above a threshold, in other examples a determination is made as to whether the loop variable coarse capacitor array code is: (a) above or equal to a threshold, (b) below a threshold, or (c) below or equal to a threshold.

In block 665, a temperature sensor output is measured. A temperature sensor conversion result for loop index i may be referred to herein as $D_{TEMP,i}$ at $T_i$. In examples, measuring a temperature sensor output requires a temperature chamber that can reach $T_i$. Thus, if $T_0$=−20° C., $T_1$=25° C., and $T_2$=50° C., then a temperature chamber that can reach between at least −20° C. and 50° C. is required in one example. In some examples, an accuracy of a temperature chamber is within 1° C. for each $T_i$. In examples, a time series measurement of the device under test (DUT) temperature is used to determine whether the DUT has stabilized.

In one example, a temperature sensor output code is a 10-bit number. In this example, an effective resolution may be set to 9 bits and can result in the least significant bit (LSB) being 0.

In block 670 the current value for the loop variable for temperature is incremented. For example, the current value for the loop variable for temperature i can be incremented by 1 according to an example. Thus, in this example, if i is 0 in block 665, then i is incremented by 1 to set i at 1 in block 670. As another example, if i is 2 in block 615, then i is incremented by 1 to set i at 3 in block 670. In various examples, i can be incremented or decremented by any suitable value.

In block 675, a determination is made as to whether the current value for the loop variable for temperature is above a threshold. For example, if loop variable for temperature i is less than a threshold value of 3, then in one example method 600 returns to block 610. In this example, if i is not less than 3, then method 600 proceeds to block 680. Thus, in an example where i is set to 0 in block 605, i is incremented by 1 in block 670, and a determination is made as to whether i is less than 3 in block 675, method 600 loops from block 610 through block 675 three times: $T_0$, $T_1$, and $T_2$. In one example $T_0$ is −20° C., $T_1$ is 25° C., and $T_2$ is 50° C. The threshold can be any suitable value in various examples. While block 675 is described with respect to making a determination as to whether the loop variable for temperature is above a threshold, in other examples a determination is made as to whether the loop variable for temperature is: (a) above or equal to a threshold, (b) below a threshold, or (c) below or equal to a threshold.

Figure 8:
FIG. 8 shows an example measurement table for the example method shown in FIG. 6 according to an example.

Referring now to FIG. 7 and FIG. 8, these figures show example measurement table 700 and example measurement table 800 for block 605 through block 675 of method 600 shown in FIG. 6. In example measurement table 700 shown in FIG. 7, i was set to 0 in block 605, i was incremented by 1 in block 670, and a threshold value of three was used in block 675. Moreover, in example measurement table 700, p was set to 0 in block 635, p was incremented by 1 in block 660, and a threshold value of nine was used in block 660. In this example, for each value of p (i.e., p=0 through p=9), a coarse capacitor array code $CC_p$ is determined. Moreover, in this example, for each value of i (i.e., i=0 through i=2) a fine capacitor array code and a slope of FBAR frequency with respect to the fine capacitor array code measured in ppm/code are determined for each value of p (i.e., through p=9) at temperature $T_i$. Thus, in this example, 30 fine capacitor array codes and 30 slopes of FBAR frequency are determined (e.g., 10 fine capacitor array codes for each temperature $T_i$ and 10 slopes of FBAR frequency for each temperature $T_i$). For example, for i=2 and p=8, $FC_{2,8}$ and $f_{slope2,8}$ are determined as shown in table 700.

In FIG. 8, the temperature sensor measurements from block 670 of method 600 are shown in example measurement table 800 according to one example. In table 800, temperature sensor measurements at $T_0$ (e.g., where i=0), $T_1$ (e.g., where i=1), and $T_2$ (e.g., where i=2). In table 800, $D_{TEMP,0}$ corresponds to the temperature sensor measurement at $T_0$, $D_{TEMP,1}$ corresponds to the temperature sensor measurement at $T_1$, and $D_{TEMP,2}$ corresponds to the temperature sensor measurement at $T_2$.

Referring back to FIGS. 5 and 6, in the example shown in these figures an operating temperature range of $T_{min}$ to $T_{max}$ is provided where $T_{min}$ is −30° C. and $T_{max}$ is 95° C. In one example, the temperature sensor measurement at $T_{-30}$ is $D_{TEMP}=0$ and the temperature sensor measurement at $T_{95}$ is $D_{TEMP}=914$. In other examples, an operating temperature range of $T_{min}$ to $T_{max}$ can include any suitable $T_{min}$ and $T_{max}$. For example, in one example, $T_{min}=-45°$ C. and $T_{max}=90°$ C. and thus has an operating temperature range of −45° C. to 90° C.

Referring back to FIG. 6, in block 680 values are passed to a calibration method. For example, FC, $f_{slope}$, and $D_{TEMP}$ values may be provided to a calibration method to be used as compensation parameters for the calibration method. Thus, referring to FIG. 7 and FIG. 8, one or more $FC_{i,p}$, $f_{slope\ i,p}$, $D_{TEMPi}$ values may be provided to a calibration method to be used as compensation parameters. In one example, values are passed to calibration method 500 shown in FIG. 5. For example, method 600 may be performed and values may be passed to method 500 as compensation parameters in block 510 of method 500. In examples, one or more values are permanently written to a memory, such as an on-chip OTP memory.

In block 685, values are loaded. For example, values can be loaded to registers. In examples, values corresponding to a Trim Coefficient A, a Trim Coefficient B, a Coarse Oscillator Offset, a Fine Oscillator Offset, and an Oscillator Frequency Delta can be loaded into particular registers as shown in FIG. 9.

In examples, an ideal temperature sensor code at T is determined. For example, an ideal temperature sensor code may be determined as a linear function of the temperature.

In examples, temperature sensor parameters and temperature sensor output at operating point extremes are determined. For example, in one example, temperature sensor parameters and temperature sensor output at operating point extremes are determined using the following formulas:

$$TS_{slope}=(D_{TEMP,i}-D_{TEMP,0})/(T_1-T_0)$$

$$TS_{OFFSET}=D_{TEMP,1}-TS_{slope}*T_1$$

$$D_{TEMP,min}=TS_{slope}*T_{min}+TS_{offset}$$

$$D_{TEMP,max}=TS_{slope}*T_{max}+TS_{offset}$$

In examples, a mean slope of an FBAR frequency is determined. For example, in one example, an $f_{slope\ mean,p}$ is determined for each coarse capacitor array value $CC_p$. In this example, the following formula can be used to calculate $f_{slope\ mean,p}$:

$$f_{slope\ mean,p}=(f_{slope0,p}+f_{slope1,p}+f_{slope2,p})/3$$

In examples, a three-point curve fitting is used to determine one or more offsets and/or one or more coefficients for one or more coarse capacitor array values. For example, in one example an $OFFSET_p$, an $COEFF\_A_p$, and a $COEFF\_B_p$ are determined using a three-point curve fitting for each coarse capacitor code array value $CC_p$. In some examples, one or more parameters is rounded. For example, a parameter may be rounded to the nearest integer. In examples $OFFSET_p$, $COEFF\_A_p$, and/or $COEFF\_B_p$ may be determined as a function (e.g., a linear function, quadratic function, power function, rational function, exponential function, or a combination thereof) of $D_{TEMP,i}$.

In examples, additional offsets are determined. For example, in one example, an $OFFSET_1$, an $OFFSET_2$, an $OFFSET\_MIN_p$, an $OFFSET\_MAX_p$, and an $OFFSET\_PEAK_p$ are determined for each $OFFSET_p$.

In examples, $OFFSET_1$ may be determined based at least in part on $OFFSET_p$, $COEFF\_A_p$, $D_{TEMP,min}$, and/or $COEFF\_B_p$. For example, $OFFSET_1$ may be determined as a function (e.g., a linear function, quadratic function, power function, rational function, exponential function, or a combination thereof) of $OFFSET_p$, $COEFF\_A_p$, $D_{TEMP,min}$, and/or $COEFF\_B_p$.

In examples, $OFFSET_2$ may be determined based at least in part on $OFFSET_p$, $COEFF\_A_p$, $D_{TEMP,max}$, and/or $COEFF\_B_p$. For example, $OFFSET_2$ may be determined as a function (e.g., a linear function, quadratic function, power function, rational function, exponential function, or a combination thereof) of $OFFSET_p$, $COEFF\_A_p$, $D_{TEMP,max}$, and/or $COEFF\_B_p$.

In examples, $OFFSET\_MIN_p$ may be determined by selecting the smallest offset in a set of at least two offsets. For example, if the set of offsets is $OFFSET_1$ and $OFFSET_2$ for p and $OFFSET_1$ is smaller than $OFFSET_2$, then $OFFSET_1$ can be selected as $OFFSET\_MIN_p$.

In examples, OFFSET_MAX$_p$ may be determined by selecting the largest offset in a set of at least two offsets. For example, if the set of offsets is OFFSET$_1$ and OFFSET$_2$ for p and OFFSET$_2$ is larger than OFFSET$_1$, then OFFSET$_2$ can be selected as OFFSET_MAX$_p$.

In examples, OFFSET_PEAK$_p$ may be determined based at least in part on OFFSET$_p$, COEFF_A$_p$, and/or COEFF_B$_p$. For example, OFFSET_PEAK$_p$ may be determined as a function (e.g., a linear function, quadratic function, power function, rational function, exponential function, or a combination thereof) of OFFSET$_p$, COEFF_A$_p$, and/or COEFF_B$_p$.

In examples, a fine capacitor array code that does not saturate the fine cap array is determined. In one example, p is looped through. In this example, a minimum p may be determined such that OFFSET_MIN$_p$ is above a first threshold, and OFFSET_MAX$_p$ and/or OFFET_PEAK$_p$ is below a second threshold. For example, the first threshold may be zero such that OFFSET_MIN$_p$ must be greater than zero in one example. In examples, OFFSET_MAX$_p$ and/or OFFET_ PEAK$_p$ is based on a MARGIN. For example, the second threshold may be based on a MARGIN. In examples, the MARGIN corresponds to a number of codes necessary to allow a sufficient margin for a 200 ppm modulation.

In examples, a device (such as a Bluetooth device described herein) performs temperature compensation and calibration methods described herein allowing the device to support an operating temperature range from at least −20° C. to at least 85° C. For example, in one example a calibration method described herein accommodates an operating temperature range from at least −20° C. to at least 85° C. In examples, such an operating temperature range is supported without a significant power penalty by using a compensation described herein which reduces the required tuning range of an FBAR oscillator for a given temperature range.

In some examples, the device has an FBAR oscillator with a split capacitor array which further reduces transmitter power consumption. For example, a transmitter (such as BLE transmitter 200) can have a Pierce oscillator with a split capacitor array.

Referring now to FIG. 10, this figure shows an example 1000 of a Pierce oscillator 1005 with a split capacitor array (collectively, 1010-1070) according to an example. The split capacitor array has a first capacitor array 1010 and a second capacitor array 1050. The first capacitor array 1010 has a first coarse capacitor array 1020 and a first fine capacitor array 1030. The second capacitor array 1050 has a second coarse capacitor array 1060 and a second fine capacitor array 1070.

In examples, the first coarse capacitor array 1020 and/or the second coarse capacitor array 1060 is used to correct for process variations. In this example, process trimming is performed in the first coarse capacitor array 1020 and/or the second coarse capacitor array 1060. First coarse capacitor array 1020 and/or second coarse capacitor array 1060 may have a unit capacitor of 52 fF, an on-off ratio of 4.5, a tuning step of 40 ppm, and/or a tuning range of 1400 ppm.

In examples, the first fine capacitor array 1030 and/or the second fine capacitor array 1070 is used to correct for temperature variations and for performing modulation (such as GFSK modulation in a Bluetooth transmitter). In this example the modulation and temperature trimming is performed in the first fine capacitor array 1030 and/or the second fine capacitor array 1070. First fine capacitor array 1030 and/or second fine capacitor array 1070 may have a unit capacitor of 4 fF, an on-off ratio of 2, a tuning step of 5 ppm, and/or a tuning range of 700 ppm.

Figure 11:
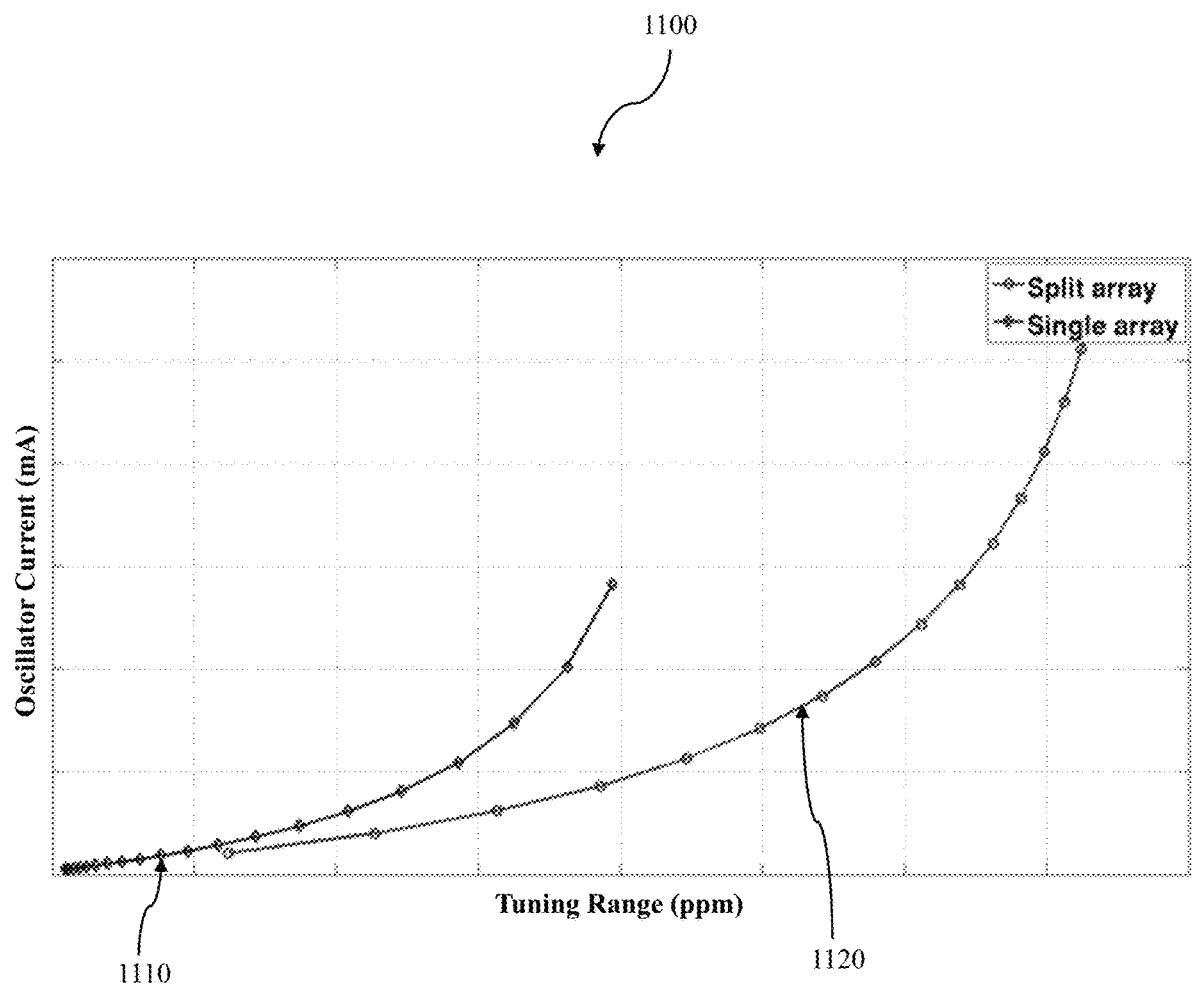
FIG. 11 shows an example chart comparing a single capacitor array to a split capacitor array according an example.

In an FBAR oscillator power consumption increases with increasing tuning range. The tuning range-power consumption tradeoff in one example is shown by graph 1100 in FIG. 11. In graph 1100, line 1110 depicts oscillator current (mA) requirements of tuning ranges (ppm) for a single consolidated capacitor array where process, temperature, and modulation tuning are performed in the same array. Line 1120 depicts oscillator current (mA) requirements of tuning ranges (ppm) for a split capacitor array where modulation and temperature trimming is performed in a fine capacitor array and process trimming is performed in a coarse capacitor array.

Referring back to FIG. 10, in examples, feeding process information into first coarse capacitor array 1020 and/or second coarse capacitor array 1060, and feeding temperature information and modulation information into first fine capacitor array 1030 and/or second fine capacitor array 1070 provides a power efficient way of adding process and temperature digital controls. Rather than the addition of process and temperature digital controls occurring in the digital domain thereby consuming energy, in some examples the addition of process and temperature digital controls are directly added in the capacitance domain which does not consume power.

Loop gain of a Pierce oscillator is increased for a given bias current in examples when the capacitance on either side of the Pierce oscillator are equal. In order to keep the on-capacitance of the two capacitor arrays as equal as possible, in examples, the capacitors are alternatively turned on as the control code increases. For example, referring to FIG. 10, if the control code is 7 then 3 caps may be on in array 1010 and 4 caps may be on in array 1050. In this example, if the control code increases to 8, an additional capacitor on array 1010 is turned on to maintain the capacitance on the left and right side of Pierce oscillator 1005. In examples, a ctrl code is split into a first (e.g., left) and a second (e.g., right) control code using the following formulas:

Fine_ctrl_left=floor(fine_ctrl/2)

Fine_ctrl_right=floor((fine_ctrl+1)/2)

Coarse_ctrl_left=floor(coarse_ctrl/2)

Coarse_ctrl_right=floor((coarse_ctrl+1)/2)

In examples, splitting a capacitor array into a first capacitor array 1010 and a second capacitor array 1050, with oscillator 1005 being between the first capacitor array 1010 and the second capacitor array 1050, improves a tuning step. In this example, from the resonator's perspective, the first capacitor array 1010 and the second capacitor array 1050 are in series with each other. In this example, when the first capacitor array 1010/second capacitor array 1050 increases by ΔC, the effective capacitor across the resonator increases by ΔC/2 which results in a tuning step that is half of what can be achievable without the first/second split.

While some examples of devices, systems, and methods herein are described in terms of software executing on various machines, the methods and systems may also be implemented as specifically-configured hardware, such as field-programmable gate array (FPGA) specifically to execute the various methods. For example, examples can be implemented in digital electronic circuitry, or in computer hardware, firmware, software, or in a combination thereof. In one example, a device may include a processor or processors. The processor comprises a computer-readable medium, such as a random access memory (RAM) coupled to the processor. The processor executes computer-executable program instructions stored in memory, such as executing one or more computer programs for editing an image. Such processors may comprise a microprocessor, a digital signal processor (DSP), an application-specific integrated circuit (ASIC), field programmable gate arrays (FPGAs), and state machines. Such processors may further comprise programmable computing devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example computer-readable storage media, that may store instructions that, when executed by the processor, can cause the processor to perform the steps described herein as carried out, or assisted, by a processor. Examples of computer-readable media may include, but are not limited to, an electronic, optical, magnetic, or other storage device capable of providing a processor, such as the processor in a web server, with computer-readable instructions. Other examples of media comprise, but are not limited to, a floppy disk, CD-ROM, magnetic disk, memory chip, ROM, RAM, ASIC, configured processor, all optical media, all magnetic tape or other magnetic media, or any other medium from which a computer processor can read. The processor, and the processing, described may be in one or more structures, and may be dispersed through one or more structures. The processor may comprise code for carrying out one or more of the methods (or parts of methods) described herein.

Examples of methods disclosed herein may be performed in the operation of such computing devices. The order of the blocks presented in the examples above can be varied—for example, blocks can be re-ordered, combined, and/or broken into sub-blocks. Certain blocks or processes can be performed in parallel. Thus, while the steps of methods disclosed herein have been shown and described in a particular order, other examples may comprise the same, additional, or fewer steps. Some examples may perform the steps in a different order or in parallel.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

That which is claimed is:

1. A method of calibrating a transmitter comprising:
for each temperature of a plurality of temperatures:
iteratively configuring a coarse capacitor array in the transmitter by iteratively setting a coarse capacitor array code for the coarse capacitor array at that temperature, the coarse capacitor array corresponding to an oscillator in the transmitter, the oscillator corresponding to a resonator in the transmitter;
iteratively configuring a fine capacitor array in the transmitter for each of the iteratively set coarse capacitor array codes at that temperature by sweeping through fine capacitor array codes for the fine capacitor array to identify a fine capacitor array code that reduces frequency offset at that coarse capacitor array code at that temperature, the fine capacitor array corresponding to the oscillator;
determining a slope of frequency corresponding to the resonator for each of the iteratively set coarse capacitor array codes at that temperature; and
measuring a temperature sensor output corresponding the transmitter at that temperature; and
using at least the identified fine capacitor array codes, the determined slopes of frequency corresponding to the resonator, and the measured temperature sensor outputs to calibrate the transmitter.

2. The method of claim 1, further comprising:
prior to iteratively configuring the fine capacitor array, setting a fine capacitor array code for the fine capacitor array to a maximum value.

3. The method of claim 1, further comprising:
prior to iteratively configuring the coarse capacitor array, setting a coarse capacitor array code for the coarse capacitor array to a minimum coarse capacitor array code; and
increasing the coarse capacitor array code in each iterative step of said iteratively configuring the coarse capacitor array.

4. The method of claim 3, wherein the minimum coarse capacitor array code corresponds to a minimum code that achieves a frequency below a target frequency.

5. The method of claim 3, wherein the minimum coarse capacitor array code establishes a calibration boundary.

6. The method of claim 3, wherein the minimum coarse capacitor array code corresponds to a maximum value which results in a measured frequency less than a target carrier frequency.

7. The method of claim 6, wherein the measured frequency is 200 ppm less than the target carrier frequency.

8. The method of claim 1, wherein the plurality of temperatures comprises a first temperature below at least −10 degrees Celsius, a second temperature above at least 75 degrees Celsius, and a third temperature between the first temperature and the second temperature.

9. The method of claim 1, wherein the resonator comprises a thin-film bulk acoustic resonator ("FBAR").

10. The method of claim 9, wherein determining the slope of frequency corresponding to the FBAR comprises incrementing an offset of a fine capacitor array.

11. A method comprising:
obtaining a temperature of an oscillator in a transmitter, the oscillator corresponding to a resonator in the transmitter;
determining a frequency drift corresponding to the oscillator at the temperature based at least in part on a linear term corresponding to the temperature and a temperature shift;

generating a temperature compensation signal based at least in part on the frequency drift;
generating a data modulation signal based at least in part on a modulation scheme;
tuning a capacitor array corresponding to the oscillator based at least in part on the temperature compensation signal and the data modulation signal; and
after tuning the capacitor array corresponding to the oscillator, generating, by the oscillator, a modulated RF signal within a threshold frequency drift.

12. The method of claim 11, wherein the oscillator comprises a Pierce oscillator coupled to the capacitor array.

13. The method of claim 12, wherein the capacitor array comprises a split capacitor array comprising at least one coarse capacitor array and at least one fine capacitor array.

14. The method of claim 13, further comprising:
generating a tuning signal at least by adding the temperature compensation signal and the data modulation signal, and
wherein tuning the capacitor array comprises outputting the tuning signal to the at least one fine capacitor array.

15. The method of claim 14, further comprising:
generating a second tuning signal; and
outputting the second tuning signal to the at least one coarse capacitor array, the second tuning signal configured to tune the at least one coarse capacitor array to account for process variations.

16. The method of claim 11, wherein determining the frequency drift comprises calculating the frequency drift based at least in part on the temperature, a turnover temperature, the linear term corresponding to the temperature and the temperature shift, and a gain coefficient corresponding to the temperature and the temperature shift.

17. The method of claim 11, wherein the resonator comprises a thin-film bulk acoustic resonator ("FBAR").

18. The method of claim 17, wherein a turnover temperature corresponds to the FBAR.

19. The method of claim 11, wherein the linear term is received from a register of a processor of the transmitter or from a memory of the transmitter.

20. The method of claim 11, wherein the temperature compensation signal is based at least in part on a three-point curve fitting of the capacitor array.

21. The method of claim 11, wherein the modulation scheme is Gaussian Frequency Shift Keying (GFSK).

22. The method of claim 11, wherein the transmitter has an operating temperature range of at least minus 20 degrees Celsius to at least 85 degrees Celsius after tuning the capacitor array.

23. The method of claim 11, wherein the temperature compensation signal is a digital signal.

24. The method of claim 11, wherein the temperature compensation signal is an analog signal.

25. A system comprising:
a resonator;
a Pierce oscillator corresponding to the resonator;
a split capacitor array corresponding to the Pierce oscillator, the split capacitor array comprising:
a first capacitor array coupled to a first side of the Pierce oscillator, the first capacitor array comprising a first fine capacitor array; and
a second capacitor array coupled to a second side of the Pierce oscillator opposite the first side, the second capacitor array comprising a second fine capacitor array;
a temperature sensor;
a memory; and
a processor communicatively coupled to the Pierce oscillator, the split capacitor array, the temperature sensor, and the memory, wherein the processor is configured to receive executable instructions from the memory which, when executed by the processor, cause the processor to:
obtain a temperature from the temperature sensor;
determine a frequency drift corresponding to the Pierce oscillator at the temperature based at least in part on a linear term corresponding to the temperature and a temperature shift;
generate a temperature compensation signal based at least in part on the frequency drift;
generate a data modulation signal based at least in part on a modulation scheme;
generate a tuning signal based at least in part on the temperature compensation signal and the data modulation signal; and
output the tuning signal to at least one of the first fine capacitor array or the second fine capacitor array.

26. The system of claim 25, wherein the resonator comprises a thin-film bulk acoustic resonator ("FBAR").

27. The system of claim 26, wherein the first capacitor array further comprises a first coarse capacitor array, and the second capacitor array further comprises a second fine capacitor array, and
wherein the processor is further configured to receive executable instructions from the memory which, when executed by the processor, cause the processor to:
generate a second tuning signal configured to account for process variations; and
output the second tuning signal to at least one of the first coarse capacitor array or the second fine capacitor array.

28. The system of claim 27, wherein the FBAR is configured to generate a modulated RF signal within a threshold frequency drift subsequent to the output of the tuning signal.

29. The system of claim 26, wherein:
a BLE transmitter comprises the Pierce oscillator, the FBAR, the split capacitor array, the temperature sensor, the memory, and the processor, and
the BLE transmitter has an operating temperature range of at least minus 20 degrees Celsius to at least 85 degrees Celsius after the output of the tuning signal to the at least one of the first fine capacitor array or the second fine capacitor array.

30. The system of claim 26, wherein the tuning signal comprises the temperature compensation signal and the data modulation signal combined together.

31. A non-transitory computer-readable medium comprising processor-executable instructions configured to cause a processor to:
obtain a temperature of an oscillator in a transmitter, the oscillator corresponding to a resonator in the transmitter;
determine a frequency drift corresponding to the oscillator at the temperature based at least in part on a linear term corresponding to the temperature and a temperature shift;
generate a temperature compensation signal based at least in part on the frequency drift;
generate a data modulation signal based at least in part on a modulation scheme;
tune a capacitor array corresponding to the oscillator based at least in part on the temperature compensation signal and the data modulation signal; and after tuning the capacitor array corresponding to the oscillator, cause the oscillator to generate a modulated RF signal within a threshold frequency drift.

32. The non-transitory computer-readable medium of claim 31, wherein the resonator comprises a thin-film bulk acoustic resonator ("FBAR").

33. The non-transitory computer-readable medium of claim 31, further comprising processor-executable instructions configured to cause a processor to:
generate a tuning signal at least by adding the temperature compensation signal and the data modulation signal, and
output the tuning signal to at least one fine capacitor array to tune the capacitor array.

34. The non-transitory computer-readable medium of claim 33, further comprising processor-executable instructions configured to cause a processor to:
generate a second tuning signal; and
output the second tuning signal to at least one coarse capacitor array, the second tuning signal configured to tune the at least one coarse capacitor array to account for process variations.

35. The non-transitory computer-readable medium of claim 31, further comprising processor-executable instructions configured to cause a processor to calculate the frequency drift based at least in part on the temperature, a turnover temperature, the linear term corresponding to the temperature and the temperature shift, and a gain coefficient corresponding to the temperature and the temperature shift.

* * * * *